(12) United States Patent
Takahashi et al.

(10) Patent No.: US 12,219,889 B2
(45) Date of Patent: Feb. 4, 2025

(54) SEMICONDUCTOR STORAGE DEVICE

(71) Applicant: KIOXIA CORPORATION, Tokyo (JP)

(72) Inventors: Masahiro Takahashi, Yokohama Kanagawa (JP); Yoshiaki Asao, Kawasaki Kanagawa (JP); Yukihiro Nomura, Taito Tokyo (JP); Daisaburo Takashima, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 332 days.

(21) Appl. No.: 17/679,948

(22) Filed: Feb. 24, 2022

(65) Prior Publication Data

US 2022/0393106 A1 Dec. 8, 2022

(30) Foreign Application Priority Data

Jun. 3, 2021 (JP) .................................. 2021-093747

(51) Int. Cl.
*H10N 70/00* (2023.01)
*G11C 13/00* (2006.01)
*H10B 63/00* (2023.01)
*H10N 70/20* (2023.01)

(52) U.S. Cl.
CPC ....... *H10N 70/8828* (2023.02); *G11C 13/004* (2013.01); *G11C 13/0069* (2013.01); *H10B 63/30* (2023.02); *H10B 63/84* (2023.02); *H10N 70/231* (2023.02)

(58) Field of Classification Search
CPC ... H10N 70/8828; G11C 13/004; H10B 63/84
See application file for complete search history.

(56) References Cited

U.S. PATENT DOCUMENTS

2020/0403035 A1    12/2020   Ogiwara et al.

FOREIGN PATENT DOCUMENTS

JP    2021-002629 A    1/2021

*Primary Examiner* — Anthony Ho
(74) *Attorney, Agent, or Firm* — Kim & Stewart LLP

(57) ABSTRACT

A semiconductor storage device includes a memory cell including a core portion that extends in a first direction above a semiconductor substrate; a variable resistance layer that extends in the first direction and is in contact with the core portion; a semiconductor layer that extends in the first direction and is in contact with the variable resistance layer; a first insulator layer that extends in the first direction and is in contact with the semiconductor layer; and a first voltage applying electrode that extends in a second direction orthogonal to the first direction and is in contact with the first insulator layer. The core portion is a vacuum region, or a region containing inert gas.

20 Claims, 38 Drawing Sheets

FIG. 16

| $D_{MH}$(nm) | CORE PORTION | THERMAL RESISTIVITY (Kcm/W) | $I_{CELL}$ | PEAK TEMPERATURE (a.u.) |
|---|---|---|---|---|
| 70 | SiO$_2$ | 71 | $I_1$ | 0.904 |
| | Air@1700K | 1031 | $I_1$ | 0.919 |
| | Air@300K | 4149 | $I_1$ | 0.920 |
| 100 | SiO$_2$ | 71 | $I_2$ | 0.829 |
| | Air@1700K | 1031 | $I_2$ | 0.877 |
| | Air@300K | 4149 | $I_2$ | 0.881 |
| 120 | SiO$_2$ | 71 | $I_3$ | 0.801 |
| | Air@1700K | 1031 | $I_3$ | 0.859 |
| | Air@300K | 4149 | $I_3$ | 0.862 |

SiO₂

Air1031[Kcm/W]

Air4149[Kcm/W]

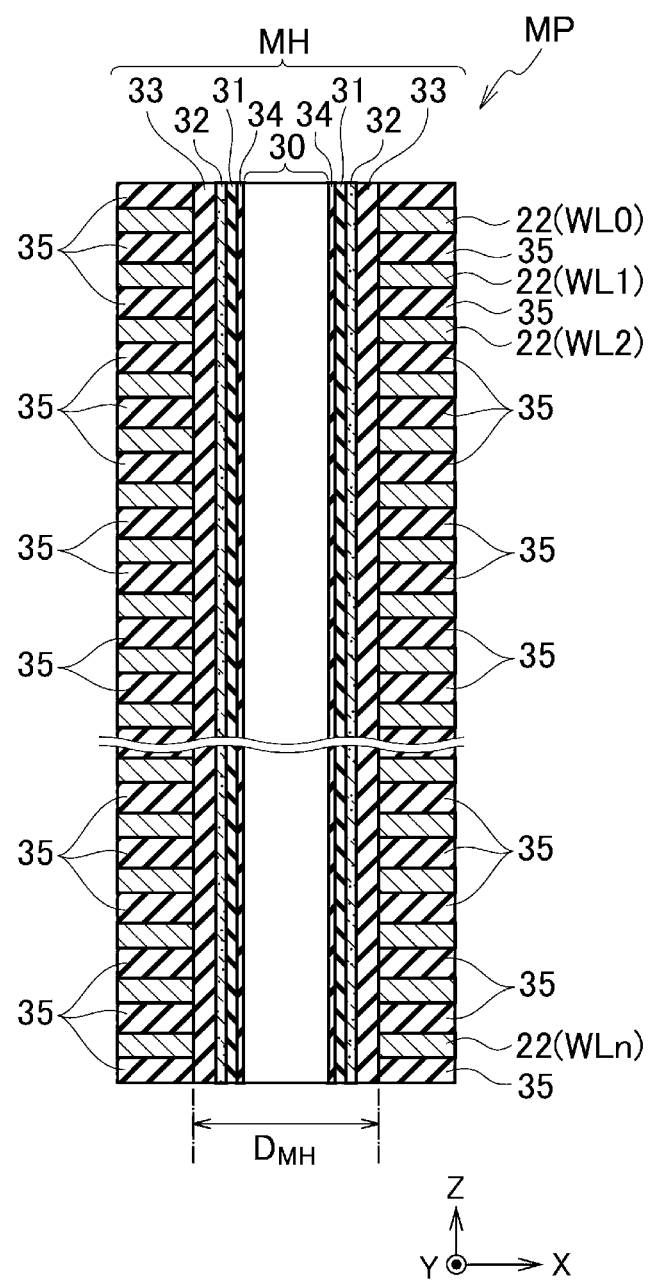

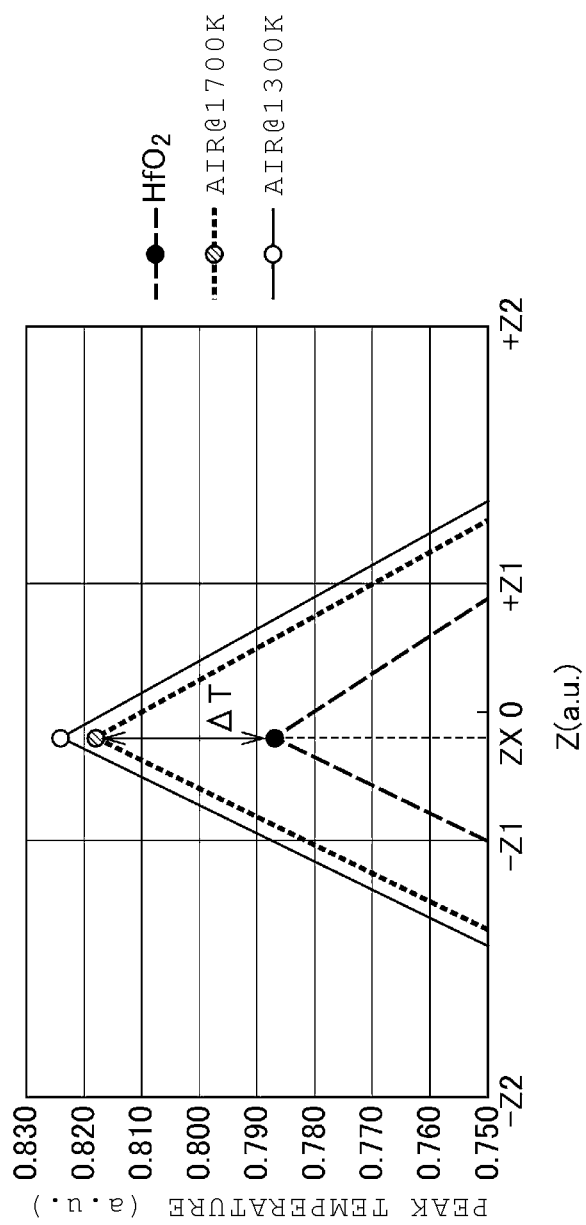
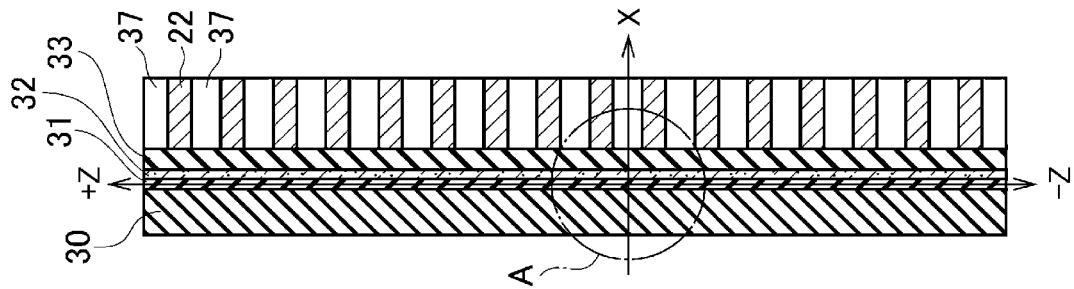
FIG. 36A
FIG. 36B

SEMICONDUCTOR STORAGE DEVICE

CROSS-REFERENCE TO RELATED APPLICATION

This application is based upon and claims the benefit of priority from Japanese Patent Application No. 2021-093747, filed Jun. 3, 2021, the entire contents of which are incorporated herein by reference.

FIELD

Embodiments described herein relate generally to a semiconductor storage device.

BACKGROUND

In some semiconductor storage devices, variable resistance storage elements, such as a resistive random access memory (ReRAM) element, an alloy-type phase change memory (PCM) element, and an interfacial phase change memory (iPCM) element, are integrated on a semiconductor substrate.

DESCRIPTION OF THE DRAWINGS

FIG. 16 shows a simulation result of thermal resistivity, a cell current, and a peak temperature for different materials of a core portion of a memory pillar and for different diameters of a memory hole in the semiconductor storage device according to the first embodiment.

FIG. 22 is a cross-sectional view of a memory pillar in the semiconductor storage device according to a second embodiment.

FIG. 36A is a view of a cross-sectional structure used for the simulation in the semiconductor storage device according to the third embodiment, and FIG. 36B shows a simulation result of peak temperatures along different positions in a Z direction near an area A of FIG. 36A for different materials of the core portion.

DETAILED DESCRIPTION

Figure 1:
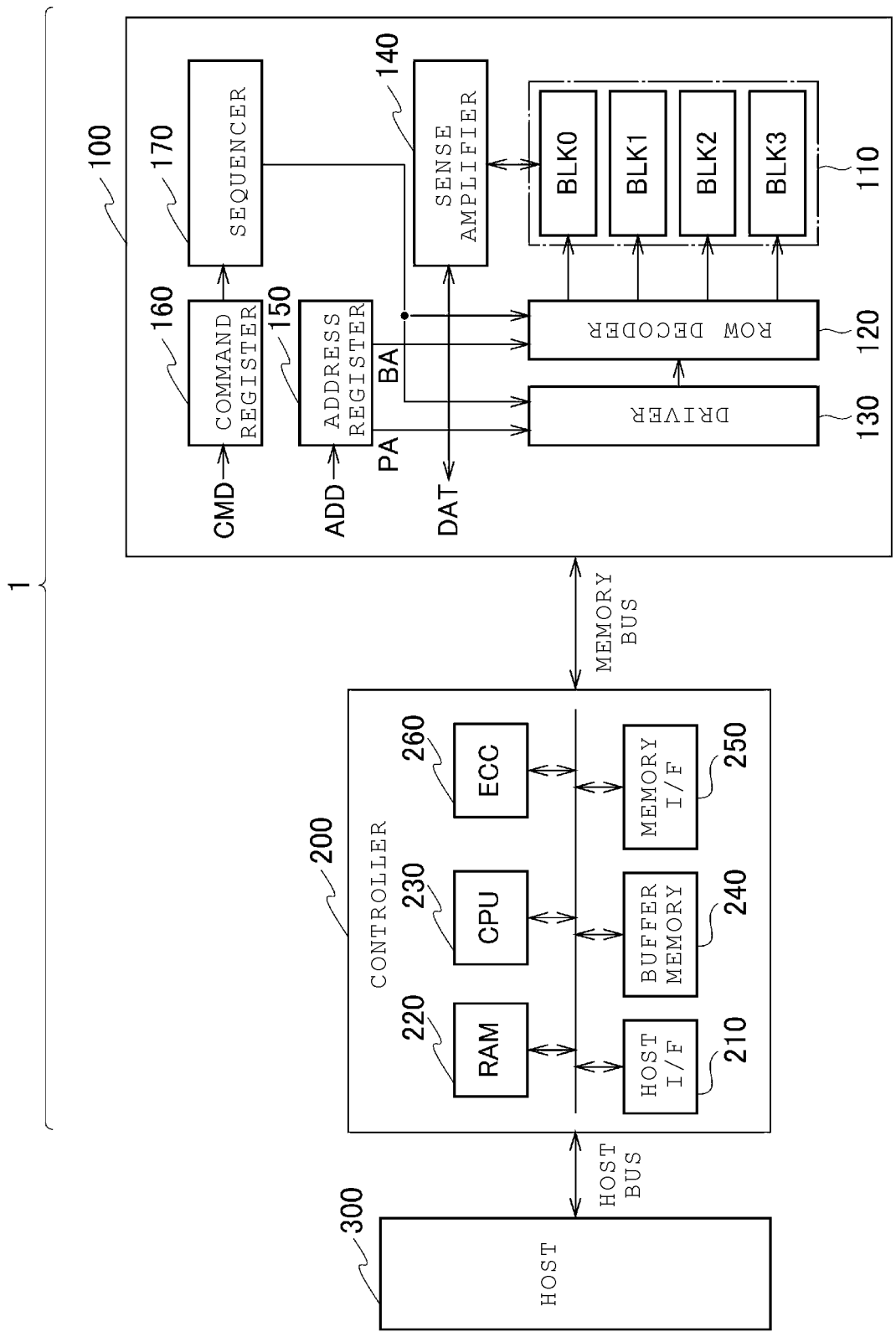
FIG. 1 is a block configuration diagram of a memory system including a semiconductor storage device according to a first embodiment.

Embodiments provide a semiconductor storage device having a three-dimensional structure that can increase a heat generation temperature in a memory cell, improve localization of a heat generation portion, and reduce disturbance to adjacent memory cells.

In general, according to one embodiment, a semiconductor storage device includes a memory cell including a core portion that extends in a first direction above a semiconductor substrate; a variable resistance layer that extends in the first direction and is in contact with the core portion; a semiconductor layer that extends in the first direction and is in contact with the variable resistance layer; a first insulator layer that extends in the first direction and is in contact with the semiconductor layer; and a first voltage applying electrode that extends in a second direction orthogonal to the first direction and is in contact with the first insulator layer. The core portion is a vacuum region, or a region containing inert gas.

First Embodiment

Hereinafter, embodiments are described with reference to the drawings. In the following description, components having the same function and configuration are designated by a common reference numeral.
(Memory System)
First, a block configuration of a memory system 1 including a semiconductor storage device according to a first embodiment is described with reference to FIG. 1.

The memory system 1 illustrated in FIG. 1 includes a memory chip 100 and a controller 200. For example, the memory chip 100 and the controller 200 may be integrated as one semiconductor device, and examples thereof include a memory card or an SSD.

The memory chip 100 includes a plurality of memory cells and stores data in a non-volatile manner. The controller 200 is connected to the memory chip 100 by a memory bus and is connected to a host 300 by a host bus. Also, the controller 200 controls the memory chip 100 and responds to a host command received from the host 300 to access the memory chip 100. The host 300 is, for example, a digital camera or a personal computer, and the host bus is, for example, a bus that conforms to a memory interface standard. The memory bus transmits and receives a signal according to the memory interface standard.
(Configuration of Controller 200)
Next, details of the configuration of the controller 200 are described with reference to FIG. 1.

As illustrated in FIG. 1, the controller 200 includes a host interface circuit (host I/F) 210, a built-in memory (Random Access Memory: RAM) 220, a processor (Central Processing Unit: CPU) 230, a buffer memory 240, a memory interface circuit (memory I/F) 250, and an error checking and correcting (ECC) circuit 260.

The host interface circuit 210 is connected to the host 300 via a host bus and transmits a host command and data received from the host 300 to the processor 230 and the buffer memory 240, respectively. The host interface circuit 210 responds to the instruction of the processor 230 and transmits data in the buffer memory 240 to the host 300.

The processor 230 controls operations of the entire controller 200. For example, when a host command relating to reading is received from the host 300, the processor 230 responds to the host command and causes the memory interface circuit 250 to issue a read command (memory command) to the memory chip 100. When a host command relating to writing is received from the host 300, the processor 230 responds to the host command and causes the memory interface circuit 250 to issue a write command (memory command) to the memory chip 100. The processor 230 also performs various processes (such as wear leveling) for managing the memory chip 100.

The memory interface circuit 250 is connected to the memory chip 100 via a memory bus and manages communication with the memory chip 100. Also, the memory interface circuit 250 transmits various signals to the memory chip 100 and receives various signals from the memory chip 100 based on the instruction received from the processor 230.

The buffer memory 240 temporarily stores write data for the memory chip 100 and read data from the memory chip 100.

The built-in memory 220 is, for example, a semiconductor memory such as DRAM or SRAM and is used as a work area of the processor 230. Also, the built-in memory 220 stores firmware for managing the memory chip 100, and various management tables such as a shift table, a history table, and a flag table, described below.

The ECC circuit 260 performs error detection and error correction processes relating to the data stored in the memory chip 100. That is, the ECC circuit 260 generates an error correction code when writing data, places the error correction code in the write data, and decodes the error correction code when reading the data.
(Configuration of Memory Chip 100)
Subsequently, the configuration of the memory chip 100 is described.

The memory chip 100 illustrated in FIG. 1 includes a memory cell array 110, a row decoder 120, a driver circuit 130, a sense amplifier 140, an address register 150, a command register 160, and a sequencer 170.

The memory cell array 110 includes a plurality of blocks BLK including a plurality of nonvolatile memory cells associated with rows (word lines) and columns (bit lines). In FIG. 1, for example, four blocks BLK0 to BLK3 are illustrated. Also, the memory cell array 110 stores data received from the controller 200.

The row decoder 120 selects any one of the blocks BLK0 to BLK3 based on a block address BA in the address register 150 and also selects a word line direction for the selected block BLK.

The driver circuit 130 supplies a voltage via the row decoder 120 with respect to the selected block BLK based on the page address PA in the address register 150. The driver circuit 130 includes, for example, a source line driver.

The sense amplifier 140 includes a sense amplifier module SA for each bit line BL, and senses data read from the memory cell array 110 in case of reading the data and performs required calculation. Also, this data DAT is output to the controller 200. In case of writing the data, the write data DAT received from the controller 200 is transmitted to the memory cell array 110.

The address register 150 stores an address ADD received from the controller 200. In this address ADD, the block address BA and the page address PA are provided. The command register 160 stores a command CMD received from the controller 200.

The sequencer 170 controls operations of the entire memory chip 100 based on the command CMD stored in the command register 160.

(Circuit Configuration of Memory Cell Array 110)

Subsequently, the equivalent circuit configuration of the memory cell array 110 is described with reference to FIG. 2.

Figure 2:
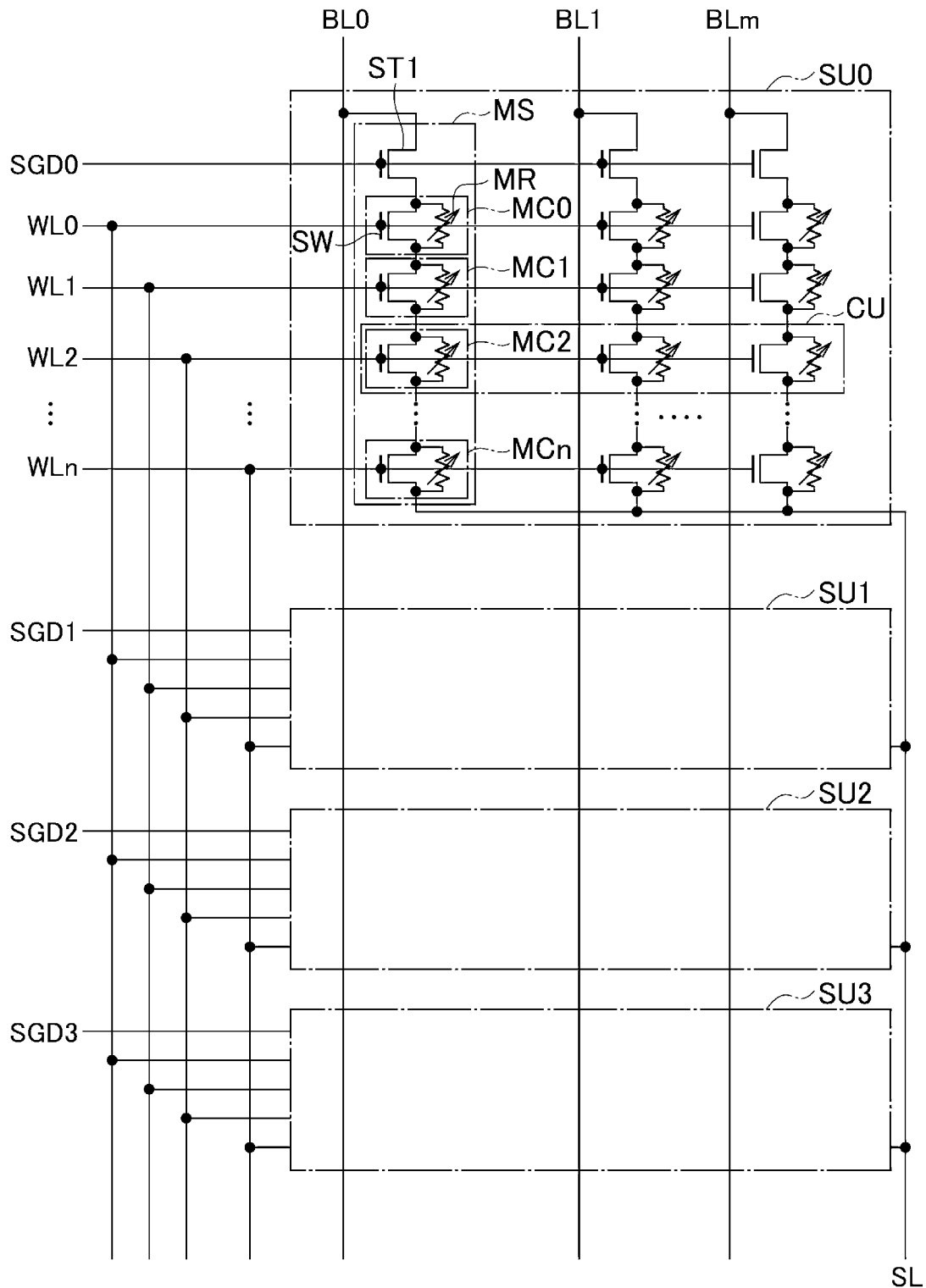
FIG. 2 is a diagram illustrating an equivalent circuit configuration of the memory cell array of FIG. 1.

As illustrated in FIG. 2, the block BLK of the memory cell array 110 includes, for example, four string units SU (SU0 to SU3). Any number of the string units SU may be provided in the block BLK. Each of the string units SU includes a plurality of memory cell strings MS.

Each of the memory cell strings MS includes, for example, n+1 memory cells MC (MC0 to MCn) (here, n is a natural number of 1 or more) and a select transistor ST1. Hereinafter, when the description is not limited to one of the memory cells MC0 to MCn, the memory cells MC0 to MCn are denoted as the memory cells MC. Further, one or any number of the select transistors ST1 may be provided in each of the memory cell strings MS.

The memory cell MC includes a storage element (more specifically, a variable resistance storage area, a variable resistance layer, or a variable resistance element) MR, and a selector SW. Examples of the storage element MR include an alloy-type phase transition element ($Ge_2Sb_2Te_5$). The storage element MR according to the first embodiment enters a state of low resistance or high resistance according to the change in its crystal state. Hereinafter, the change in the crystal state of the storage element MR is referred to as a "phase change", a case where the storage element MR enters a low resistance state (LRS) is referred to as a "set state", and a case where the storage element MR enters a high resistance state (HRS) is referred to as a "reset state". For example, when the crystal state changes to an amorphous state, the storage element MR enters a high resistance state. When the crystal state changes to a crystalized state, the storage element MR enters a low resistance state. When the selected memory cell MC is in a high resistance state (reset), the voltage of the bit line BL slowly decreases. When the selected memory cell MC is in a low resistance state (set), the voltage of the bit line BL rapidly decreases. In addition, according to the first embodiment, the selector SW includes a semiconductor layer, a gate insulating film, and a gate electrode. In the memory cell MC, the storage element MR and the selector SW are connected in parallel. The number of the memory cells MC provided in each of the memory cell strings MS may be 8, 32, 48, 64, 96, or 128, and is not limited to any particular number.

(When Memory Cell MC is Not Selected)

When the memory cell MC is not selected, the selector SW enters an on state (conductive state).

Figure 3:
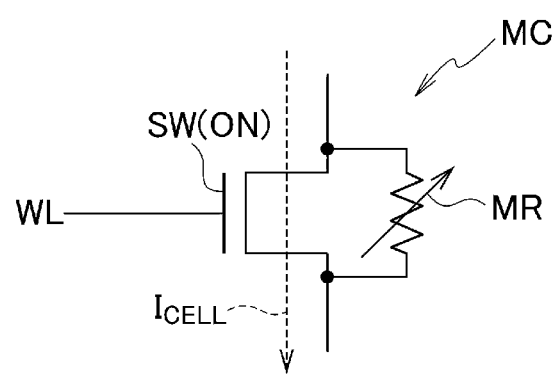
FIG. 3 is a diagram illustrating a path of a current that flows in a memory cell when a selector is in an on state in the semiconductor storage device according to the first embodiment.

FIG. 3 is a circuit diagram illustrating a path of a current that flows in the memory cell when the selector SW is in an on state, in the semiconductor storage device according to the first embodiment.

As illustrated in FIG. 3, when the selector SW is in an on state, an inversion layer is formed on the semiconductor layer of the selector SW, and thus the current flows through the inversion layer. The resistance value of the storage element MR in the low resistance state is higher than the resistance value of the semiconductor layer in the on state of the selector SW by 10 times or more. Therefore, the current does not flow into the storage element MR connected in parallel. A unit that stores data in the memory cell MC is the storage element MR. Therefore, the expression "a current does not flow into the storage element MR" means that the memory cell is not selected.

(When Memory Cell MC is Selected)

When the memory cell MC is selected, the selector SW enters an off state (non-conductive state).

Figure 4:
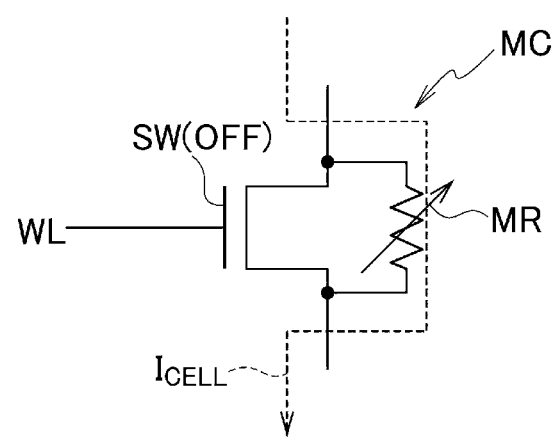
FIG. 4 is a diagram illustrating a path of a current that flows in a memory cell when a selector is in an off state in the semiconductor storage device according to the first embodiment.

FIG. 4 is a circuit diagram illustrating a path of a current that flows in the memory cell when the selector SW is in an off state in the semiconductor storage device according to the first embodiment.

As illustrated in FIG. 4, when the selector SW is in an off state, an inversion layer is not formed on the semiconductor layer of the selector SW. The resistance value of the storage element MR in the high resistance state is lower than the resistance value of the semiconductor layer in the off state of the selector SW by 10 times (one digit) or more. Therefore, the current does not flow through the semiconductor layer, and the current flows through the storage element MR connected in parallel. The expression "the current may flow through the storage element MR" means that the memory cell MC is selected.

Referring back to FIG. 2, the memory cell array 110 is continuously described. The memory cells MC0 to MCn respectively provided in the memory cell strings MS are connected between the select transistor ST1 and a source line SL in series. The control gates (a plurality of control gates) of the memory cells MC0 of the respective memory cell strings MS provided in the same block BLK is commonly connected to a word line WL0. In the same manner, the control gates of the memory cells MC1 to MCn of the plurality of memory cell strings MS provided in the same block BLK are commonly connected to the word lines WL1 to WLn, respectively.

Hereinafter, when the description is not limited to one of the word lines WL0 to WLn, the word lines WL0 to WLn are denoted as the word lines WL.

In the following description, the plurality of memory cells MC respectively connected to the common word lines WL in the string units SU are referred to as cell units (CU). Also, a set of 1-bit data stored in the cell unit is referred to as a "page". Accordingly, when 2-bit data is stored in one memory cell MC, the cell unit stores data for two pages.

The gates of the plurality of select transistors ST1 in the string unit SU are commonly connected to the select gate line SGD. Specifically, the gates of the plurality of select transistors ST1 in the string unit SU0 are commonly connected to the select gate line SGD0. In the same manner, the gates of the plurality of select transistors ST1 in the string unit SU1 are commonly connected to the select gate line SGD1. The same description applies to the string units SU2 and SU3.

Hereinafter, when the description is not limited to one of the select gate lines SGD (SGD0, SGD1, . . . ), the select gate lines SGD (SGD0, SGD1, . . . ) are denoted as the select gate lines SGD.

Each of the select gate lines SGD and the word lines WL is independently controlled by the row decoder 120.

The drains of the select transistors ST1 of the memory cell strings MS in the same column in the memory cell array 110 are commonly connected to the bit lines BL (BL0 to BLm) (where, m is a natural number of 1 or more). That is, the bit lines BL are commonly connected to the memory cell strings MS across the plurality of blocks BLK. Further, the sources of the plurality of memory cells MCn are commonly connected to the source line SL.

That is, the string unit SU includes the plurality of memory cell strings MS that are connected to the different bit lines BL and connected to the same select gate line SGD. The block BLK includes the plurality of string units SU that share the word lines WL. Also, the memory cell array 110 includes the plurality of blocks BLK that share the bit lines BL.

(Structure of Memory Cell)

An example of a cross-sectional structure of a memory pillar MP of the semiconductor storage device according to the first embodiment is described.

Figure 5:
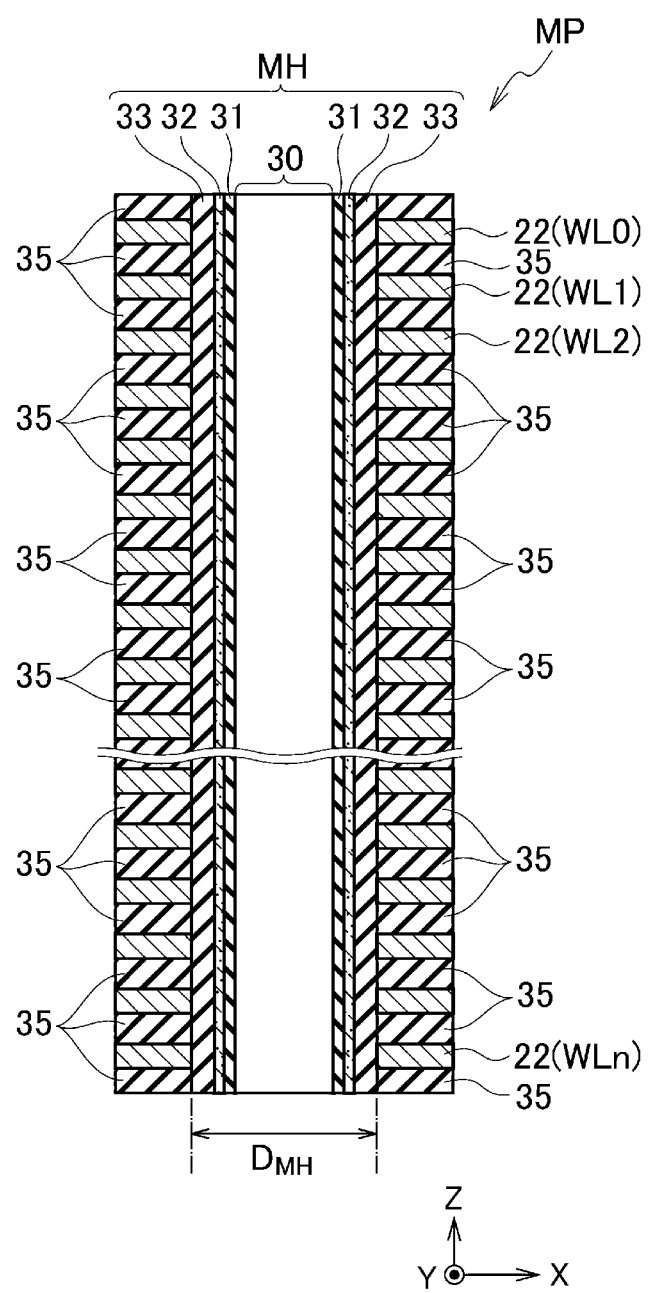
FIG. 5 is a cross-sectional view of a memory pillar of the semiconductor storage device according to the first embodiment.

FIG. 5 is an example of the cross-sectional structure of the memory pillar MP that is three-dimensionally stacked in the semiconductor storage device according to the first embodiment. As illustrated in FIG. 5, the memory pillar MP includes, for example, conductor layers 22.

Insulator layers 35 and the conductor layers (voltage applying electrodes) 22 are alternately stacked. The conductor layers 22 are formed in a plate shape expanding, for example, along an X-Y plane. For example, the plurality of stacked conductor layers 22 are used as the word lines WLn to WL0, respectively. The conductor layer 22 includes, for example, tungsten (W).

The memory pillar MP has a columnar shape extending along a Z direction and penetrates the conductor layers 22. The memory pillar MP includes, for example, a core portion 30, a variable resistance layer 31, a semiconductor layer 32, and an insulator layer 33. Specifically, a memory hole MH that penetrates the stacked structure of the conductor layers 22 and the insulator layers 35 is provided. The memory hole MH has a cylindrical shape extending, for example, in the Z direction. The memory pillar MP includes the insulator layer 33, the semiconductor layer 32, the variable resistance layer 31, and the core portion 30, which are stacked sequentially in that order in the memory hole MH (inner wall). Specifically, the memory pillar MP includes the cylindrical insulator layer 33 that covers the inner wall of the memory hole MH and extends in the Z direction, the cylindrical semiconductor layer 32 that covers the inner wall of the insulator layer 33 and extends in the Z direction, and the cylindrical variable resistance layer 31 that covers the inner wall of the semiconductor layer 32 and extends in the Z direction. A diameter $D_{MH}$ of the memory hole MH is as illustrated in FIG. 5.

The core portion 30 has a columnar shape extending, for example, in the Z direction. A material having a higher heat resistance than $SiO_2$ may be employed as the core portion 30. Further, vacuum or an inert gas may be employed as the core portion 30.

The degree of vacuum when the core portion 30 is removed to form a vacuum region, is in the ranges of $10^5$ Pa to $10^2$ Pa in a low vacuum, $10^2$ Pa to $10^{-1}$ Pa in a medium vacuum, $10^{-1}$ Pa to $10^{-5}$ Pa in a high vacuum, and $10^{-5}$ Pa to $10^{-8}$ Pa in an ultra-high vacuum.

When the core portion 30 is filled with an inert gas, for example, a rare gas such as helium, neon, argon, krypton, xenon, radon, or oganesson, or a nitrogen gas may be used.

The variable resistance layer 31 covers the side surface (outer circumference) of the core portion 30 (in contact with the core portion 30). The variable resistance layer 31 extends, for example, in the Z direction and is provided with a cylindrical shape.

The heat generation temperature on the variable resistance layer 31 of the memory element can be increased by employing a material having a higher heat resistance than $SiO_2$, a vacuum, or an inert gas in the core portion 30.

The semiconductor layer 32 in the memory pillar MP covers the side surface (outer circumference) of the variable resistance layer 31 (in contact with the variable resistance layer 31). The semiconductor layer 32 in the memory pillar MP extends, for example, in the Z direction and is provided with a cylindrical shape. The thickness of the variable resistance layer 31 is, for example, 20 nm or less. The diameter of the core portion 30 is larger than the thickness of the variable resistance layer 31 and is, for example, several tens of nanometers or more.

When the memory cell MC is selected, the cell current flows through a thin area of the variable resistance layer 31 that is in contact with the semiconductor layer 32. Therefore, the thickness of the variable resistance layer 31 is made sufficiently thinner than the diameter of the core portion 30. The current density flowing through the variable resistance layer 31 can be set to be high by causing the thickness of the variable resistance layer 31 to be sufficiently thinner than the diameter of the core portion 30. As a result, the heat generation temperature in the memory element can be increased to improve the localization of the heat generation portion so that the disturbance to the adjacent memory cell (which may cause possible data destruction in the adjacent memory cell) can be reduced.

The insulator layer 33 covers the side surface of the semiconductor layer 32. The insulator layer 33 includes a portion provided, for example, in a cylindrical shape. The insulator layer 33 includes, for example, an insulator such as silicon oxide ($SiO_2$).

The conductor layer 22 covers a portion of the side surface of the insulator layer 33 (in contact with the insulator layer 33) in the memory pillar MP.

(Structure of Memory Cell Array 110)

Hereinafter, an example of the cross-sectional structure of the memory cell array 110 in the semiconductor storage device according to the first embodiment is described. Further, in the drawing referred to below, an X direction corresponds to an extension direction of the bit line BL, a Y direction corresponds to an extension direction of the word line WL, and the Z direction corresponds to a direction vertical to an upper surface of a semiconductor substrate 20 on which the memory cell array 110 is formed.

Figure 6:
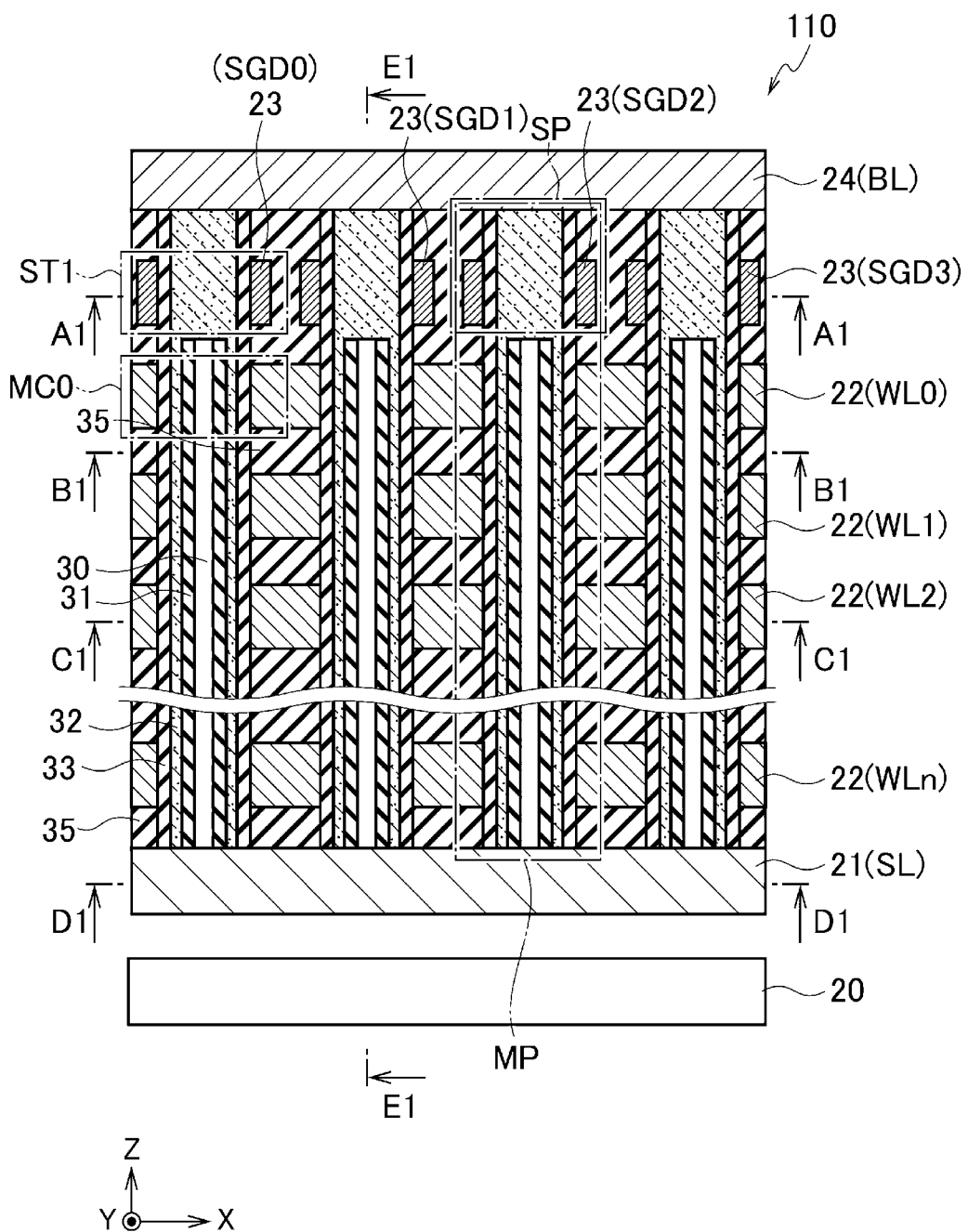
FIG. 6 is a cross-sectional view of the memory cell array of the semiconductor storage device according to the first embodiment.

FIG. 6 illustrates an example of the cross-sectional structure of the memory cell array 110 in the semiconductor storage device according to the first embodiment. As illustrated in FIG. 6, the memory cell array 110 includes, for example, conductor layers 21 to 24. The conductor layers 21 to 24 are provided over the semiconductor substrate 20.

Specifically, a conductor layer (voltage applying electrode) 21 is provided over the semiconductor substrate 20 in the Z direction via an insulator layer. For example, a circuit such as the sense amplifier 140 may be provided, for example, on the insulator layer between the semiconductor substrate 20 and the conductor layer 21. The conductor layer 21 is formed in a plate shape expanding, for example, along the X-Y plane and is used as the source line SL. The conductor layer 21 includes, for example, silicon (Si).

The insulator layers 35 and the conductor layers (voltage applying electrodes) 22 are alternately stacked over the conductor layer 21 in the Z direction. The conductor layers 22 are formed in a plate shape expanding, for example, along the X-Y plane. For example, the plurality of conductor layers 22, which are used as the word lines WLn to WL0, respectively, are stacked in order from the semiconductor substrate 20 side. The conductor layer 22 includes tungsten (W).

For example, the conductor layers (voltage applying electrodes) 23 are stacked over the conductor layers 22 (WL0) over the uppermost layer in the Z direction via an insulator layer. The conductor layer 23 extends in the Y direction and is divided for each select pillar SP described below, in the X direction. The divided conductor layers 23 are used as the select gate lines SGD0 to SGD3, respectively. The conductor layer 23 includes, for example, tungsten W.

The conductor layers (voltage applying electrode) 24 are provided over the conductor layer 23 in the Z direction. For example, the conductor layer 24 is formed in a line shape extending along the X direction and used as the bit line BL. The conductor layer 24 includes, for example, copper (Cu).

The columnar select pillar SP penetrating the conductor layer 23 is provided on the memory pillar MP. In addition, the select pillar SP includes, for example, the semiconductor layer 32 and the insulator layer 33. Specifically, the select pillar SP penetrates the conductor layer 23, is provided with an SGD hole SH of which the bottom portions reach the memory pillar MP, and sequentially provided with the insulator layer 33 and the semiconductor layer 32 in the SGD hole SH.

In addition, the layer including the boundary between the memory hole MH and the SGD hole SH is provided in the layer between the uppermost conductor layer 22 and the conductor layer 23.

The bottom portions of the core portion 30, the variable resistance layer 31, the semiconductor layer 32, and the insulator layer 33 of the memory pillar MP are in contact with the conductor layer 21.

The semiconductor layer 32 in the select pillar SP has, for example, a columnar shape. The base of the semiconductor layer 32 of the select pillar SP is in contact with the semiconductor layer 32, the variable resistance layer 31, and the core portion 30 of the memory pillar MP.

The conductor layer 23 covers a portion of the side surface of the insulator layer 33 in the select pillar SP (is in contact with the insulator layer 33).

Figure 7:
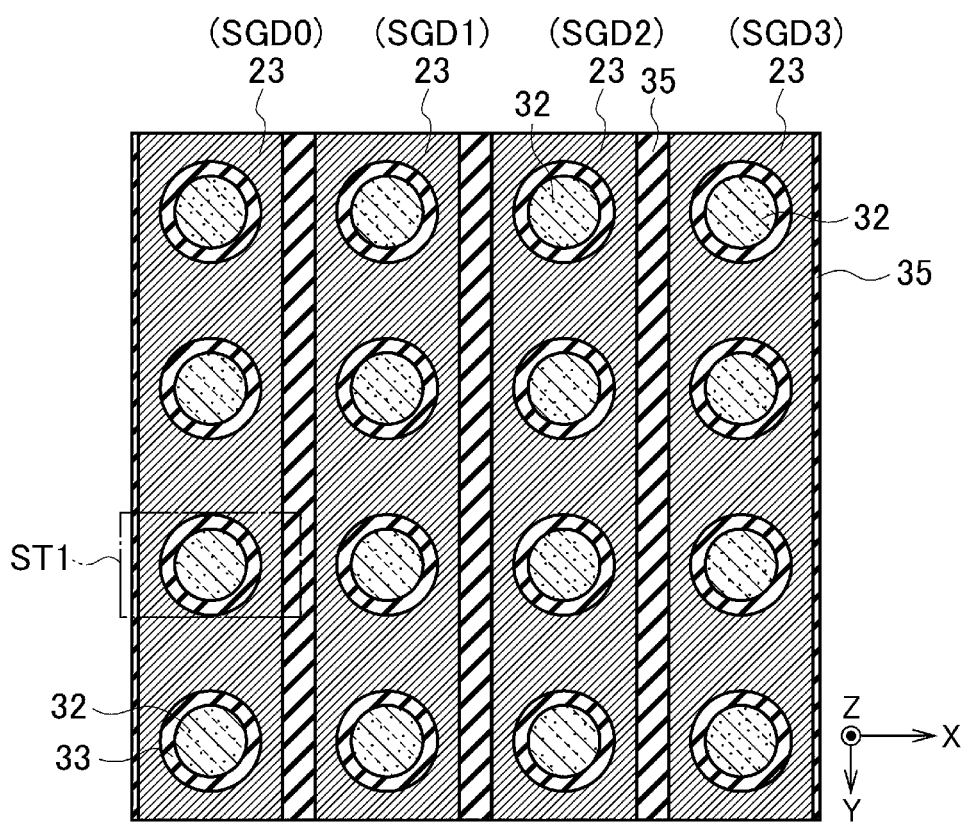
FIG. 7 illustrates a cross-section taken along line A1-A1 in FIG. 6.

Subsequently, the plane pattern configuration of the conductor layer 23 is described with reference to FIG. 7. FIG. 7 illustrates a cross-section taken along line A1-A1 in FIG. 6.

As illustrated in FIG. 7, the insulator layer 33 and the semiconductor layer 32 are provided in the SGD hole SH that penetrates the conductor layer 23. Also, the conductor layer 23 functions as the gate lines SGD0 to SGD3 of the select transistor ST1, and the insulator layer 33 functions as the gate insulating film of the select transistor ST1, and the semiconductor layer 32 functions as the semiconductor layer of the select transistor ST1. The memory pillar MP can be selected for each word line by using this select transistor ST1. By causing the select transistor ST1 to go into an on state, an inversion layer is formed on the semiconductor layer 32 that is in contact with the variable resistance layer 31 of the memory pillar MP, and the memory pillar MP can be selected by flowing the current via the inversion layer.

Subsequently, the plane pattern configuration among the memory cells MC in the Z direction is described with reference to FIG. 8.

Figure 8:
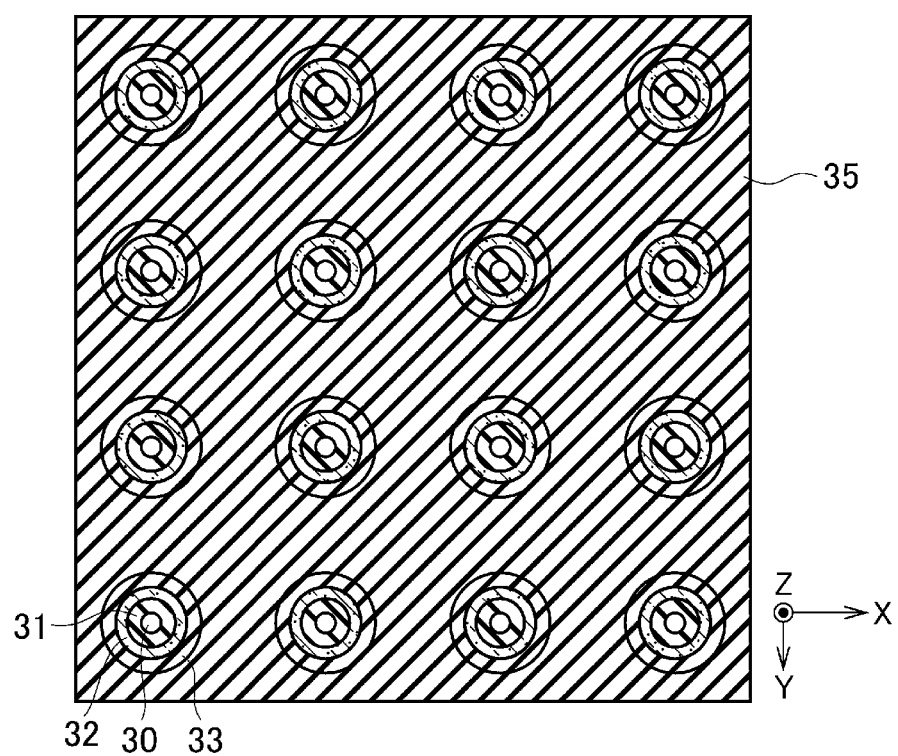
FIG. 8 illustrates a cross-section taken along line B1-B1 in FIG. 6.

FIG. 8 illustrates a cross-section taken along line B1-B1 in FIG. 6. The core portion 30, the variable resistance layer 31, the semiconductor layer 32, and the insulator layer 33 illustrated in FIG. 8 form parts of the memory cells MC in the Z direction, and the current flows in the semiconductor layer 32.

Figure 9:
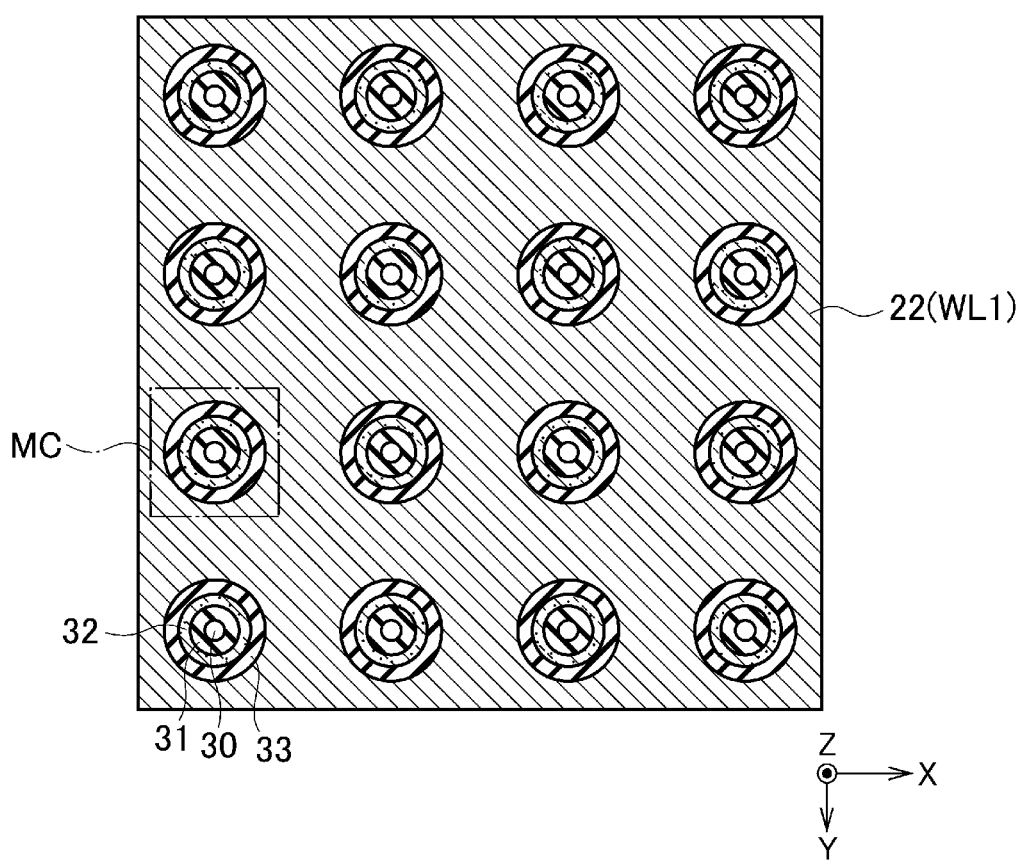
FIG. 9 illustrates a cross-section taken along line C1-C1 in FIG. 6.
Figure 10:
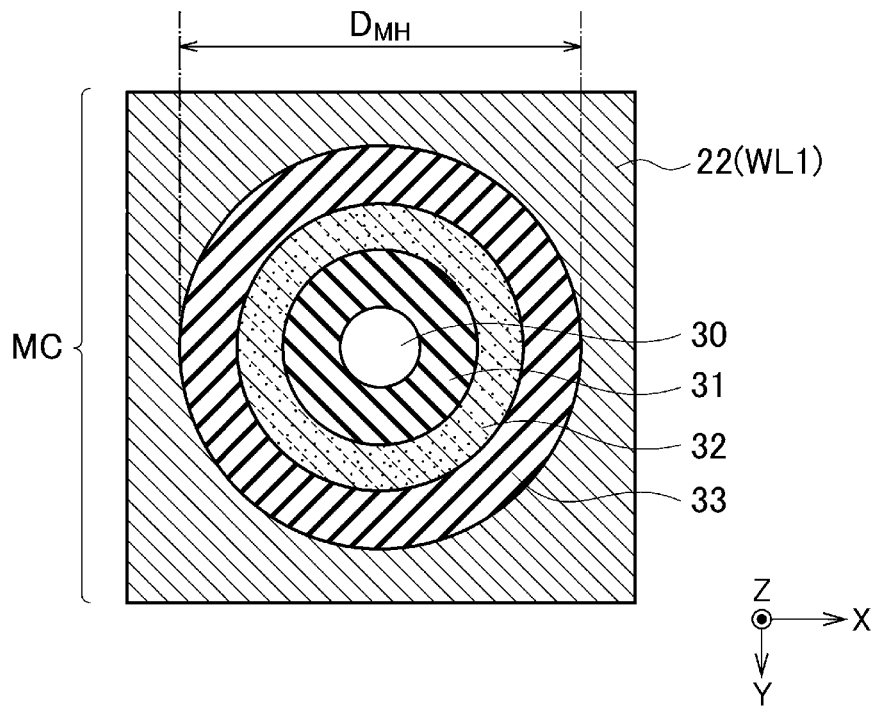
FIG. 10 is a plan view of one memory cell of the semiconductor storage device according to the first embodiment.

Subsequently, the plane pattern configuration of the conductor layer 22 is described with reference to FIGS. 9 and 10. FIG. 9 illustrates a cross-section taken along line C1-C1 in FIG. 6. FIG. 10 is a plan view of one memory cell MC.

As illustrated in FIG. 10, the memory cell MC is provided at an intersection between the plate-shaped word line WL and the memory pillar MP. Specifically, as illustrated in FIG. 10, the insulator layer 33, the semiconductor layer 32, the variable resistance layer 31, and the core portion 30 are provided in the memory hole MH penetrating the conductor layer 22 and having the diameter $D_{MH}$. Also, the conductor layer 22 functions as the word line WL of the selector SW of the memory cell MC, the insulator layer 33 functions as a gate insulating film of the selector SW of the memory cell MC, and the semiconductor layer 32 functions as the semiconductor layer of the selector SW of the memory cell MC. The variable resistance layer 31 functions as the storage element MR of the memory cell MC.

Figure 11:
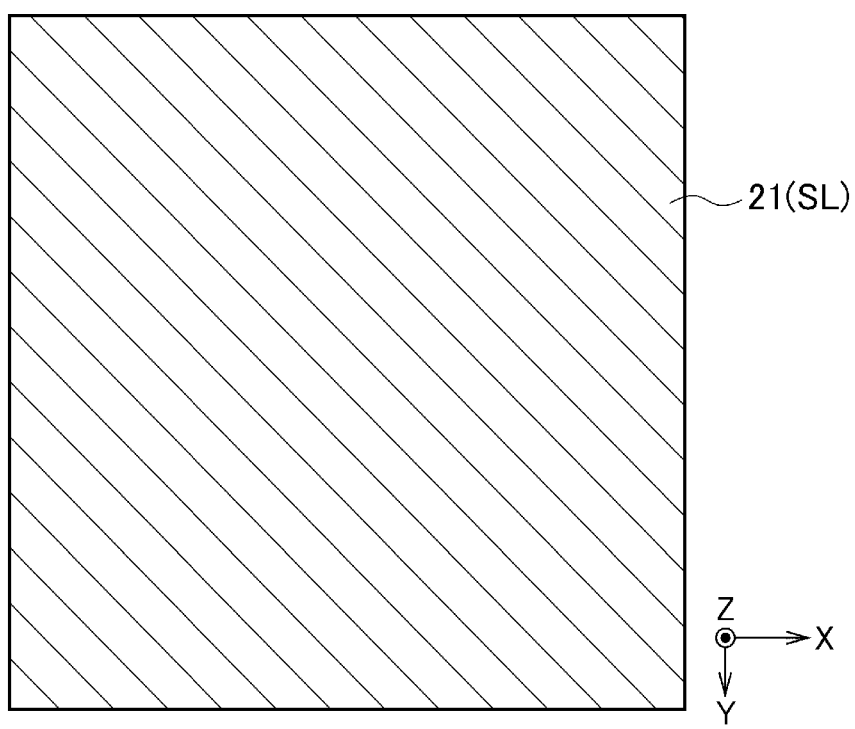
FIG. 11 illustrates a cross-section taken along line D1-D1 in FIG. 6.

Subsequently, the plane pattern configuration of the conductor layer 21 is described with reference to FIG. 11. FIG. 11 illustrates a cross-section taken along line D1-D1 in FIG. 6.

The conductor layer 21 has a plate shape and is set to be a constant low voltage so as to cause the current to flow from the bit line BL. The conductor layer 21 (source line) as illustrated in FIG. 11 has a plate shape like the conductor layer 22 (word line).

Subsequently, an example of the cross-sectional structure of the memory cell array 110 is described with reference to FIG. 12.

Figure 12:
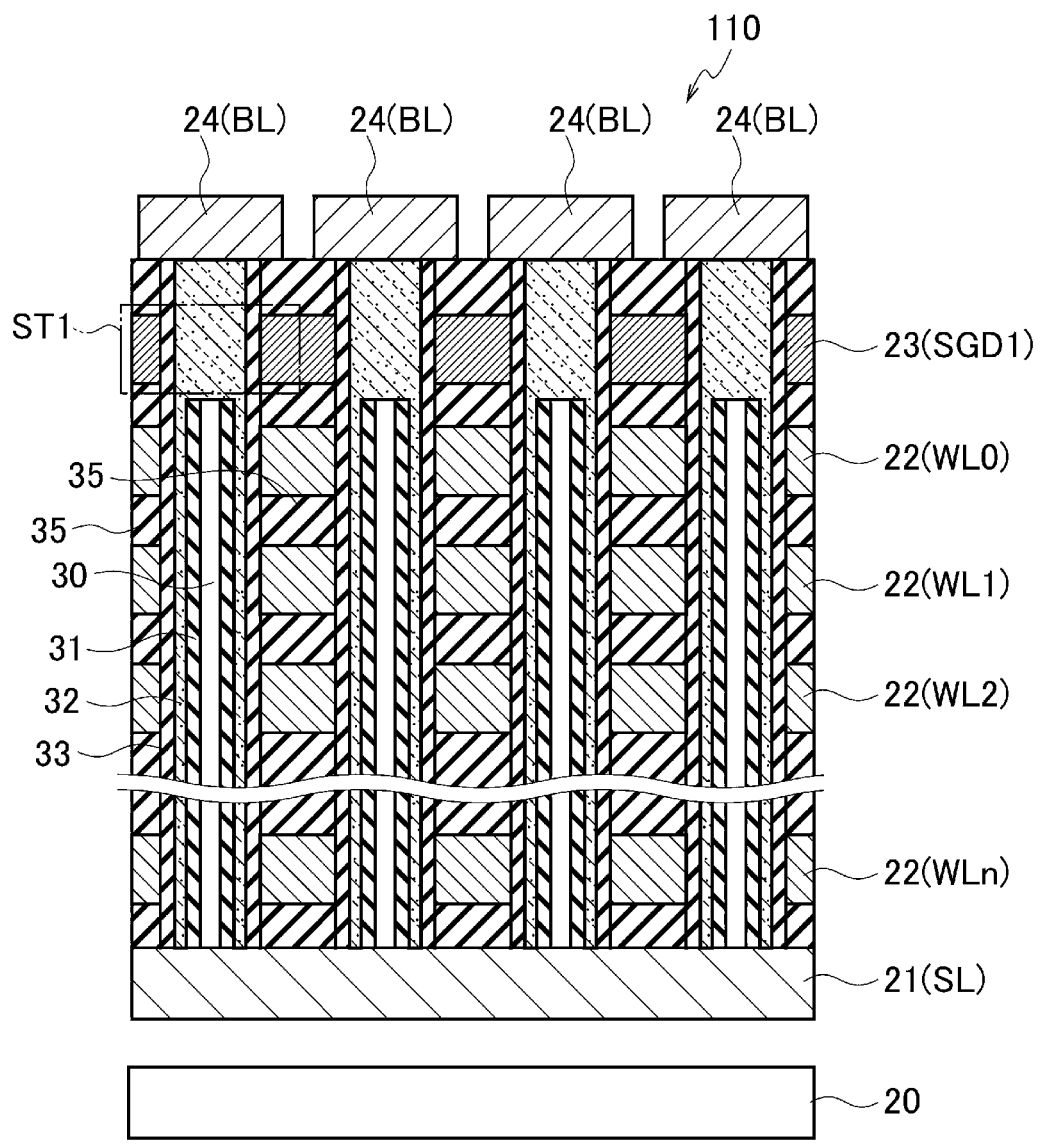
FIG. 12 illustrates a cross-section taken along line E1-E1 in FIG. 6.

FIG. 12 illustrates a cross-section taken along line E1-E1 in FIG. 6. FIG. 12 is a cross section in a direction orthogonal to FIG. 6. With reference to FIGS. 6 and 12, it is understood that the memory pillar MP has a concentric shape about the core portion 30.

(Outline of Operation)

Subsequently, in the semiconductor storage device according to the first embodiment, an outline of the operation of the memory chip 100 is described.

In the semiconductor storage device according to the first embodiment, the read operation and the write operation of the memory chip 100 are performed by flowing the current between the bit line BL and the source line SL.

Figure 13:
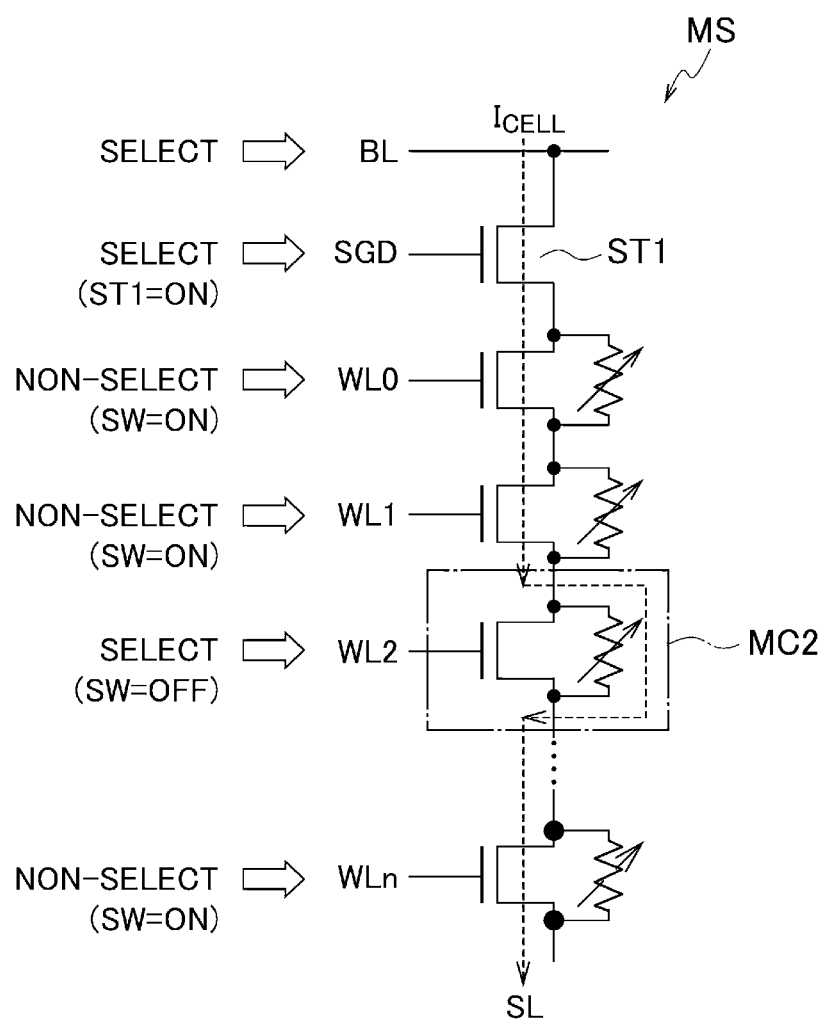
FIG. 13 is a circuit diagram of one memory cell string in the semiconductor storage device according to the first embodiment.
Figure 14:
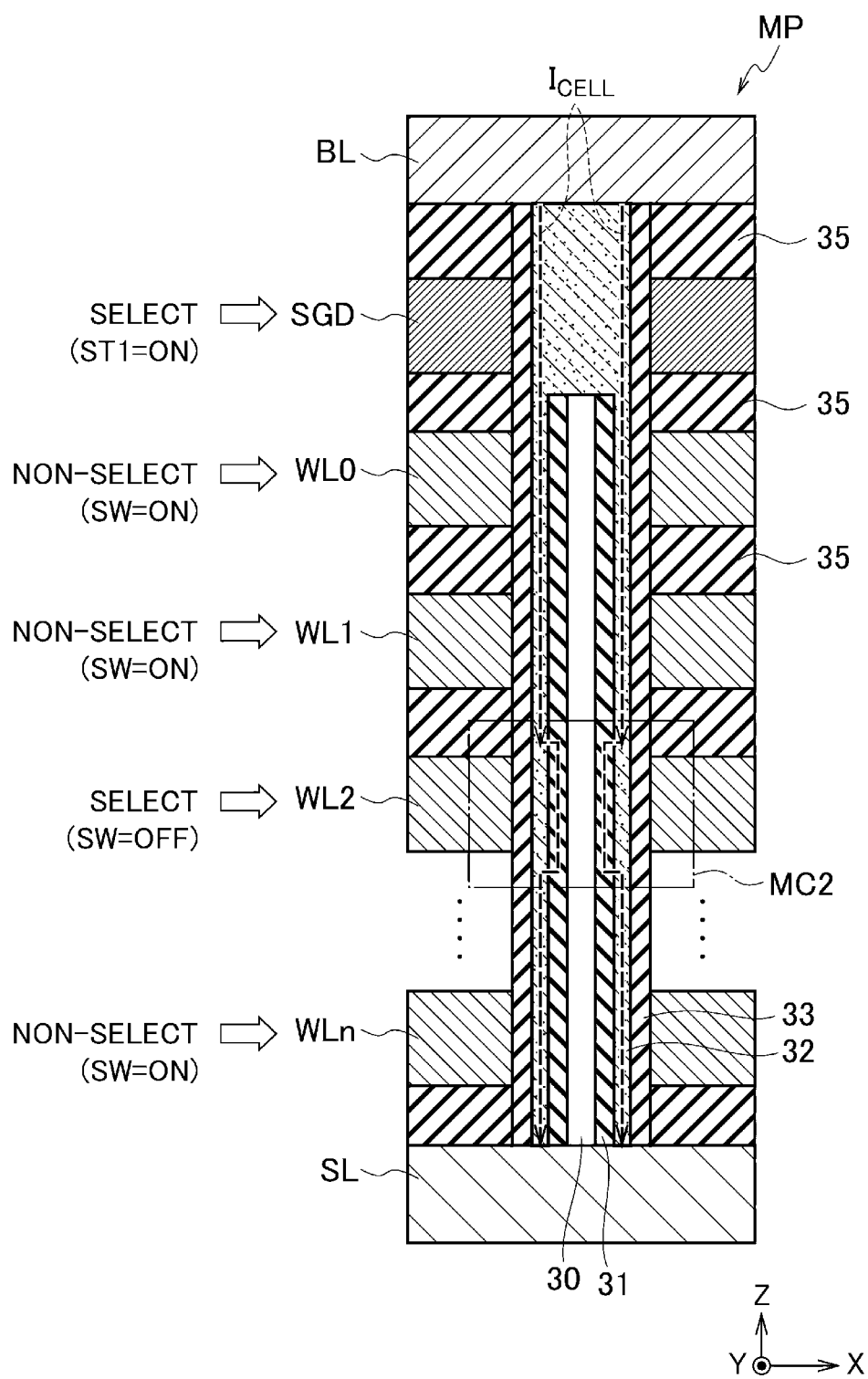
FIG. 14 is a cross-sectional view of one memory pillar corresponding to one memory cell string in the semiconductor storage device according to the first embodiment.

A method of selecting the memory cell MC to perform the read operation or the write operation is schematically described with reference to FIGS. 13 and 14. FIG. 13 is a circuit diagram of one memory cell string MS. FIG. 14 is a cross-sectional view of one memory pillar MP corresponding to one memory cell string MS.

As illustrated in FIGS. 13 and 14, a predetermined voltage (positive voltage) is applied to the gate line SGD of the select transistor ST1 that is in contact with the memory pillar MP to which the memory cell MC (for example, MC2) desired to be selected belongs. Accordingly, the inversion layer is formed on the semiconductor layer of the select transistor ST1, and enters a state in which the current can flow (on state). Accordingly, the bit line BL, the select transistor ST1, and the semiconductor layer of the memory pillar MP that is in contact with the select transistor ST1 are electrically connected. Further, the word line WL2 corresponding to the selected memory cell MC2 is set to, for example, 0 (V), and a predetermined voltage (positive voltage) is applied to the word lines WL0, WL1, and WL3 to WLn corresponding to the non-selected memory cells MC. Accordingly, the current path that flows between the bit lines BL and the source line SL flows through a variable resistance layer MR in the memory cell MC2 desired to be selected and flows through the semiconductor layers 32 of the selectors SW in the non-selected memory cells MC0, MC1, and MC3 to MCn. As illustrated in FIG. 14, since the core portion 30 is provided in the central portion of the memory pillar MP, the current in the selected memory cell MC flows through the variable resistance layer 31 that surrounds the core portion 30.

In this manner, during both the read operation and the write operation, the variable resistance layer 31 can be selected. When the operation of the semiconductor storage device according to the first embodiment is compared with that of a three-dimensional NAND-type flash memory, there is an advantage in that the operation can be performed with a lower voltage at a higher speed. In addition, there are fewer restrictions on the number of times of the rewriting, and also the writing time can be shortened.

Also, the semiconductor storage device according to the first embodiment is variable resistance-type memory that is different from the three-dimensional NAND-type flash memory, and there is no need for an erasing operation.

The write operation or the read operation is performed by causing the select transistor ST1 to go into an on state and flowing the current between the bit line BL and the source line SL. Therefore, it is not required to select all of the memory cell strings MS, and the selection can be performed for any bit line unit (column unit) connected to one select gate line.

When the memory cell strings MS that are not targets of the write operation or the read operation, are set so that the voltage of the source line=the voltage of the bit line, the write operation or the read operation is not performed.

In addition, unlike the three-dimensional NAND-type flash memory, it is not required to perform the erasing operation in the unit of the block BLK, and the write operation for the setting or resetting can be performed in the unit of the select transistor ST1.

The word line WL selects any memory cell MC in a stacking direction (the Z direction). Therefore, the word line WL may be shared between the gate electrodes of the plurality of memory cells MC in the same X-Y plane. Also, the source line SL may be shared between the plurality of memory cell strings MS. Particularly, the source line may be shared between the plurality of memory cell strings MS adjacent to each other in a bit line direction.

For example, a plate shape in which the word line WL and the source line SL extending in the bit line direction and the word line direction is considered. The memory cell MC is selected only when the select transistor ST1 goes into an on state, and the current flows from the bit line BL to the source line SL. Therefore, even when the word line WL and the source line SL in the plate shape are selected, only the memory cell MC that is in contact with the word line WL selected directly under the selected select transistor ST1 and the selected bit lines BL is selected.

In the same manner as described above, the memory cell MC is selected by flowing the current via the bit line BL. Therefore, the sequencer 170 is configured to be capable of outputting a control signal as if the read operation and the write operation are simultaneously performed for each bit line.

The sequencer 170 can output the control signal as if reset writing and set writing are simultaneously performed for each bit line.

(Timing Chart of Operation Waveform)

Figure 15:
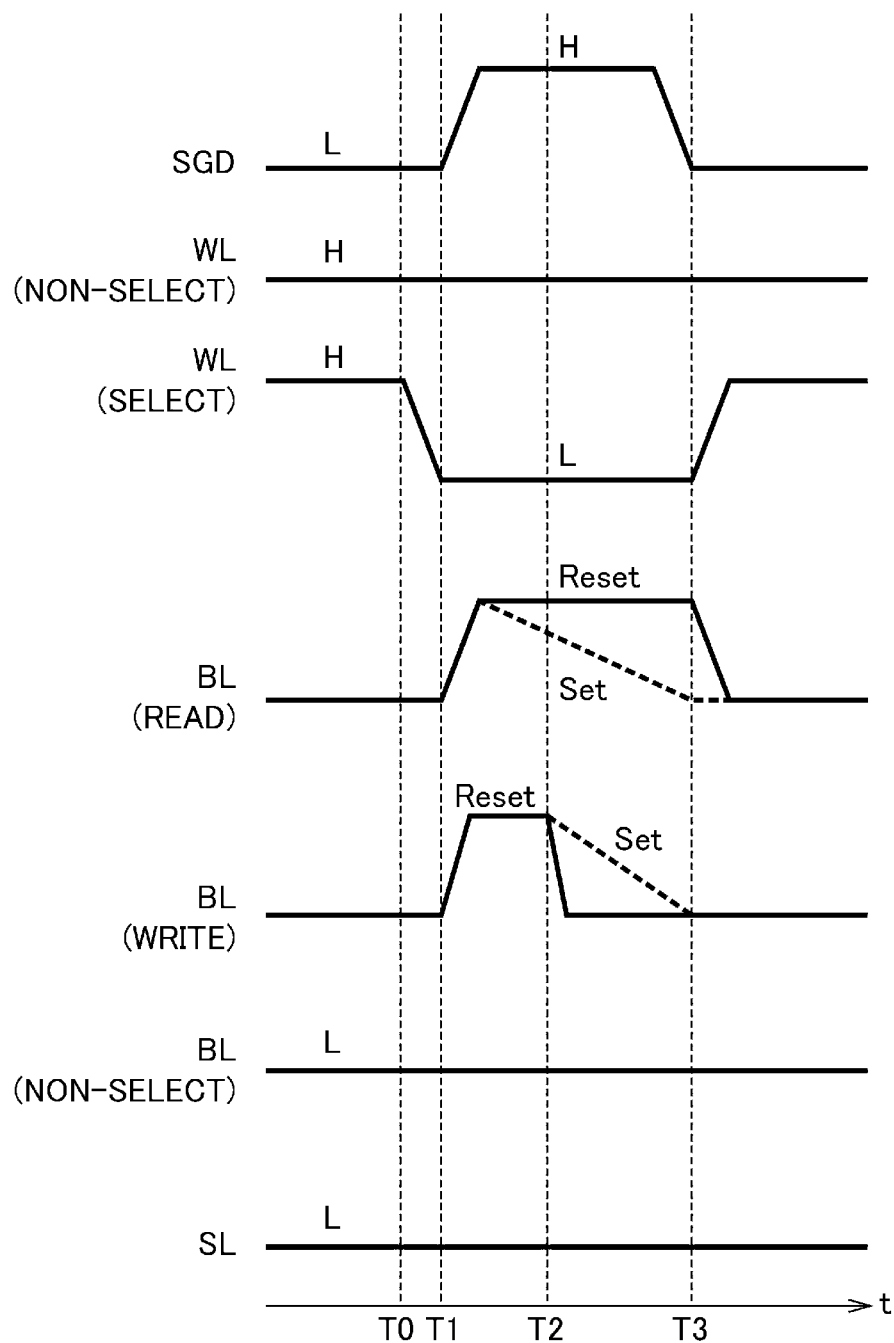
FIG. 15 is a timing chart of an operation waveform of the semiconductor storage device according to the first embodiment.

FIG. 15 is a timing chart of an operation waveform of the semiconductor storage device according to the first embodiment.

As described above, in the memory chip 100 of the semiconductor storage device according to the first embodiment, first, a voltage that causes the selector SW of the selected memory cell MC to enter an off state and causes the selector SW of the non-selected memory cells MC to enter an on state is applied to the word lines WL. Subsequently, the memory chip 100 applies a voltage that causes a select transistor corresponding to the selected memory cell MC to be turned on, to the gate line SGD so that the bit line BL and the memory pillar MP to which the selected memory cell belongs enter a conductive state. In this manner, the current flows through the semiconductor layer of the selector SW in the non-selected memory cell and flows through the storage element MR in the selected memory cell.

An operation waveform of the memory chip 100 of the semiconductor storage device according to the first embodiment is described with reference to FIG. 15.

First, a case of the read operation is described. The sequencer 170 maintains voltages of the non-selected bit lines BL and the source line in an L level and starts to decrease a voltage of the selected word line WL from an H level (L<H) at time T0, and maintains the voltage of the selected word line in an L level after time T1.

Subsequently, the sequencer 170 raises the voltage of the gate line SGD of the select transistor ST corresponding to the selected memory cell MC from the L level to the H level. In addition, potentials of the non-selected word lines WL are maintained in the H level, and thus the selectors SW are maintained in an on state in the non-selected memory cells MC.

Also, the sequencer 170 causes the bit line BL to be in a floating state after raising the voltage of the bit line BL. Accordingly, when the selected memory cell MC is in a high resistance state (reset), the voltage of the bit line BL slowly decreases (the voltage is substantially maintained until the time T3), and when the selected memory cell MC is in a low resistance state (set), the voltage of the bit line BL rapidly decreases. The sense amplifier 140 senses the "H level/L level" of the voltage of the bit line BL after a certain period of time elapses from the application of the voltage to the bit line BL to perform the read operation.

Subsequently, the case of the write operation is described. Operations at time T0 are the same as those in the read operation.

In the write operation, the sequencer 170 applies a writing pulse (voltage) to the bit line BL at the time T1 and rapidly decreases the pulse at time T2, so that the reset state with a high resistance is written. The sequencer 170 applies the writing pulse (voltage) to the bit line BL at the time T1 and slowly decreases the pulse at the time T2 so that the set state with a low resistance is written. In addition, at this time, the non-selected bit line BL maintains the voltage of the source line SL to be the same (for example, the L level). The memory cell MC is selected by applying the voltage to the bit line BL connected to the memory cell MC. If the voltage of the non-selected bit line BL is raised, erroneous selection occurs, and thus erroneous writing occurs. The voltage is selectively applied to the bit line BL desired to be read and written.

(Simulation)

A result obtained by analyzing the semiconductor storage device according to the embodiment is described with reference to results from a device simulation (thermal simulation).

FIG. 16 shows a simulation result of thermal resistivity (Kcm/W), a cell current $I_{CELL}$, and a peak temperature when the material of the core portion is $SiO_2$, air @1700K, and air @300K for different diameters $D_{MH}$ of the memory hole MH in the semiconductor storage device according to the first embodiment. The different diameters $D_{MH}$ of the memory hole MH are 70 nm, 100 nm, and 120 nm. The cell current $I_{CELL}$ is a current that flows through the memory cell string MS as illustrated in FIG. 13, and through the variable resistance layer 31 of the selected memory cell MC. The peak temperature is the highest temperature of the variable resistance layer 31 of the selected memory cell MC. The thermal conductivity of $SiO_2$ is $1.4 \times 10^{-2}$ (W/cmK), and thus the thermal resistivity is 71 (Kcm/W). In the same manner, the thermal conductivity of air @1700K is $9.7 \times 10^{-4}$ (W/cmK), and thus the thermal resistivity is 1031 (Kcm/W). The thermal conductivity of air @300K is $2.4 \times 10^{-4}$ (W/cmK), and thus the thermal resistivity is 4149 (Kcm/W). Since there is temperature dependence in the thermal conductivity of air, when air is 300K and 1700K, thermal conductivity thereof is different and the thermal resistivity thereof is different.

When the diameter $D_{MH}$ of the memory hole MH is 70 nm, and the cell current $I_{CELL}$ of $I_1$ is flowing, the peak temperatures (a.u.) are 0.904, 0.919, and 0.920 for $SiO_2$, air @1700K, and air @300K, respectively. In the same manner, when the diameter $D_{MH}$ of the memory hole MH is 100 nm, and the cell current $I_{CELL}$ of $I_2$ is flowing, the peak temperatures (a.u.) are 0.829, 0.877, and 0.881, respectively. In the same manner, when the diameter $D_{MH}$ of the memory hole MH is 120 nm, and the cell current $I_{CELL}$ of $I_3$ is flowing, the peak temperatures (a.u.) are 0.801, 0.859, and 0.862, respectively. The diameter $D_{MH}$ of the memory hole MH is preferably small for miniaturization. In the above example, according to the diameter $D_{MH}$ of the memory hole MH, the size relationship of the cell current $I_{CELL}$ is $I_1 < I_2 < I_3$. Meanwhile, the peak temperature may be high. It is noted that if the peak temperature is unnecessarily high, the high temperature may have an adverse effect on adjacent cells. As a result, the temperature may be equal to or higher than a temperature at which the data can be rewritten.

Figure 17:
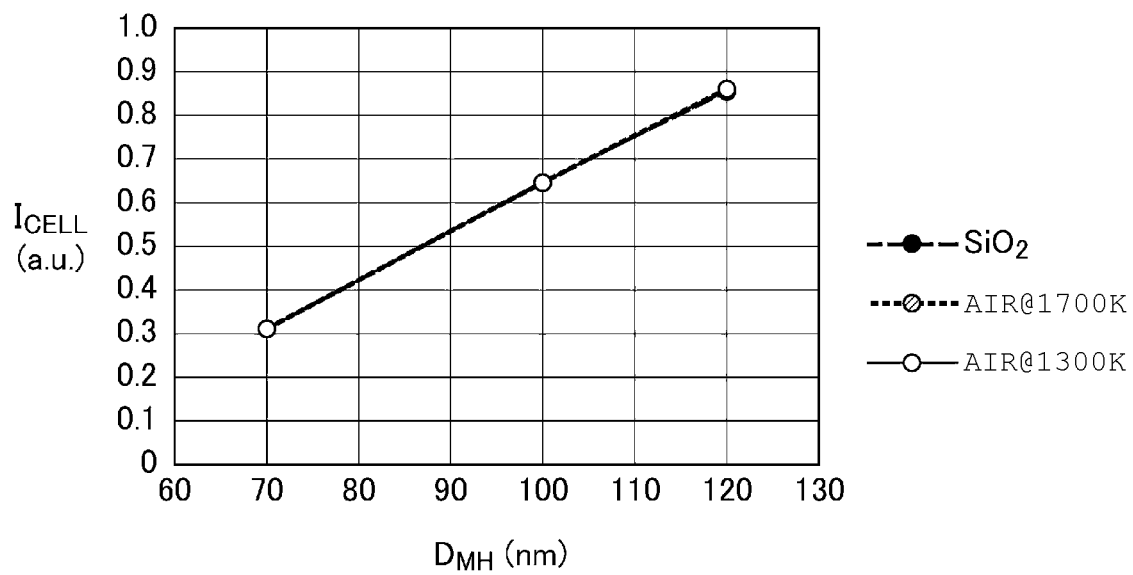
FIG. 17 shows a simulation result of a relationship between the cell current and the diameter of the memory hole for different materials of the core portion.

FIG. 17 is a simulation result of a relationship between the cell current $I_{CELL}$ (a.u.) and the diameter $D_{MH}$ (nm) of the memory hole MH when the material of the core portion is $SiO_2$, air @1700K, and air @300K in the semiconductor storage device according to the first embodiment. The reason why the relationship between the cell current $I_{CELL}$ and the diameter $D_{MH}$ of the memory hole MH does not change even if the material of the core portion is changed is because the current barely flows through the core portion. The tendency for the cell current $I_{CELL}$ to increase according to the diameter $D_{MH}$ of the memory hole MH is caused because, if the diameter $D_{MH}$ of the memory hole MH increases, the cross-sectional area of the semiconductor layer 32 or the variable resistance layer 31 increases, and thus the conduction area of the cell current $I_{CELL}$ increases.

Figure 18:
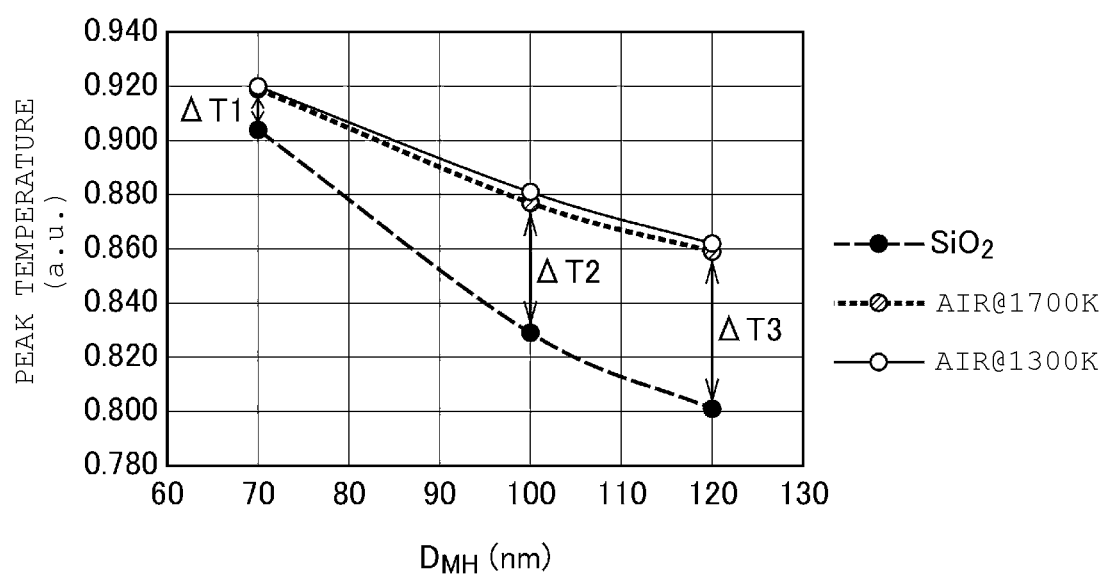
FIG. 18 shows a simulation result of a relationship between the peak temperature and the diameter of the memory hole for different materials of the core portion.

FIG. 18 shows a simulation result of relationship between the peak temperature (a.u.) and the diameter $D_{MH}$ (nm) of the memory hole MH, when the material of the core portion is $SiO_2$, air @1700K, and air @300K in the semiconductor storage device according to the first embodiment. Here, in the semiconductor storage device according to the first embodiment, a difference in the peak temperature in the amount of $\Delta T$ results when the material of the core portion is changed. When the material of the core portion is $SiO_2$, there is a large change in the peak temperature (a.u.) with respect to the diameter $D_{MH}$ (nm) of the memory hole MH compared with the cases when the material of the core portion is air @1700K and air @300K. This is because the thermal conductivity between air and $SiO_2$ differs by about 100 times. When the material of the core portion is air @1700K and air @300K, the change in the relationship between the peak temperature (a.u.) with respect to the diameter $D_{MH}$ (nm) of the memory hole MH is not as large, because, in air @1700K and air @300K, the thermal conductivity differs only by about 3 times.

As the diameter $D_{MH}$ of the memory hole MH increases, the peak temperature difference $\Delta T$ increases, such that $\Delta T1 < \Delta T2 < \Delta T3$. The peak temperature difference $\Delta T$ is a temperature difference in the variable resistance layer 31 of the selected memory cell. As the diameter $D_{MH}$ of the memory hole MH increases, the peak temperature decreases and also the heat conduction to $SiO_2$ becomes much more significant relative to the heat conduction to air, and the peak temperature difference $\Delta T$ tends to increase as the diameter $D_{MH}$ of the memory hole MH increases.

Figure 19C:
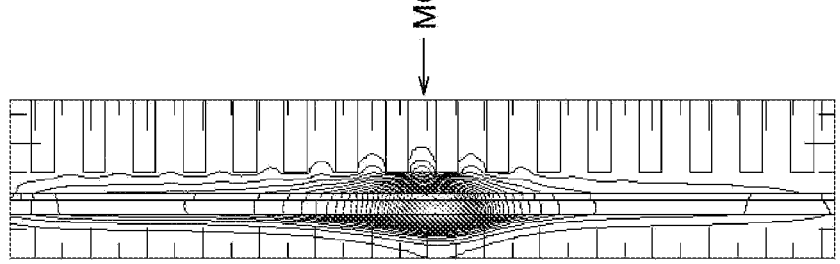
FIGS. 19A, 19B, and 19C show a simulation result of an isotherm for different materials of the core portion when the diameter of the memory hole is 120 nm.
Figure 19B:
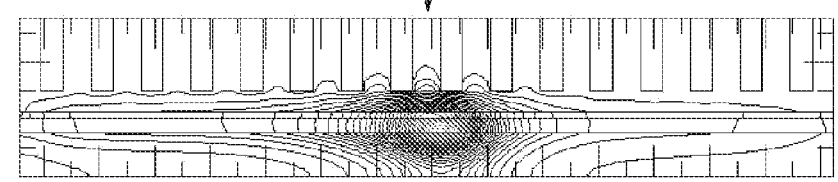
Figure 19A:
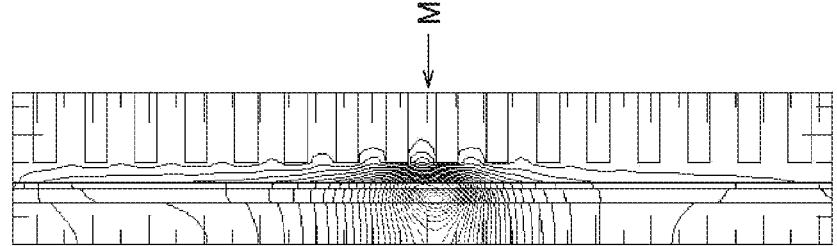

FIG. 19A shows a simulation result of an isotherm when the material of the core portion of the memory pillar in the semiconductor storage device according to the first embodiment is $SiO_2$ and the diameter $D_{MH}$ of the memory hole MH is 120 nm. FIG. 19B shows a simulation result of an isotherm when the material of the core portion is air @1700K, and FIG. 19C shows a simulation result of an isotherm when the material of the core portion is air @300K. The thermal resistance is 71 (Kcm/W) when the material of the core portion is $SiO_2$, 1031 (Kcm/W) when the material of the core portion is air @1700K, and 4149 (Kcm/W) when the material of the core portion is air @300K.

Figure 20C:
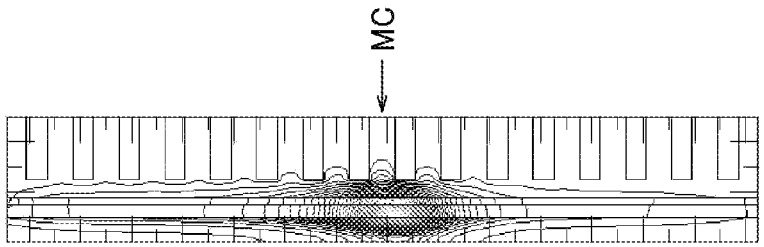
FIGS. 20A, 20B, and 20C show a simulation result of an isotherm for different materials of the core portion when the diameter of the memory hole is 100 nm.
Figure 20B:
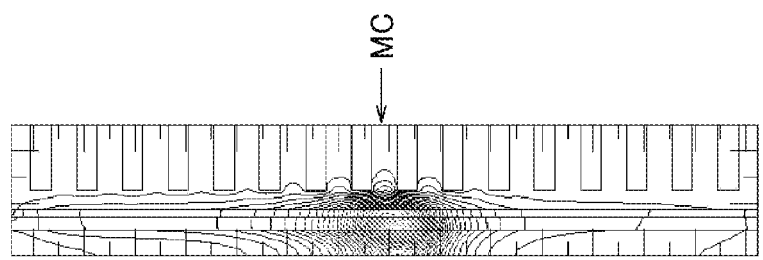
Figure 20A:
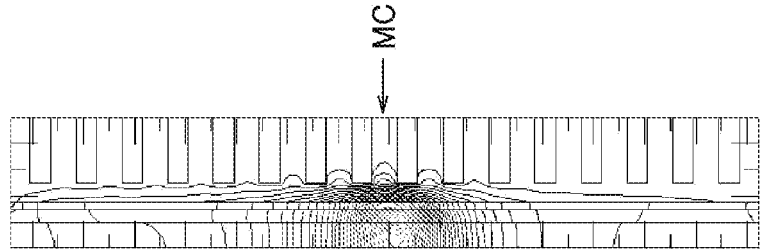

FIG. 20A shows a simulation result of the isotherm when the material of the core portion of the memory pillar in the semiconductor storage device according to the first embodiment is $SiO_2$ and the diameter $D_{MH}$ of the memory hole MH is 100 nm. FIG. 20B shows a simulation result of an isotherm when the material of the core portion is air @1700K, and FIG. 20C shows a simulation result of an isotherm when the material of the core portion is air @300K.

Figure 21A:
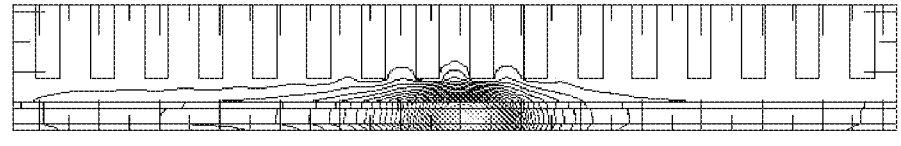
FIGS. 21A, 21B, and 21C show a simulation result of an isotherm for different materials of the core portion when the diameter of the memory hole is 70 nm.
Figure 21B:
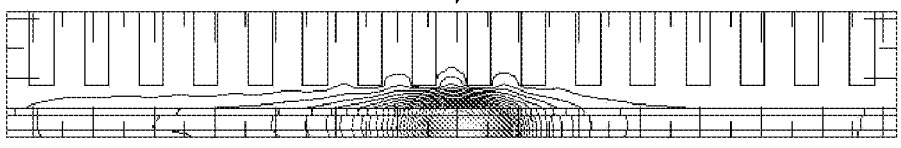
Figure 21C:
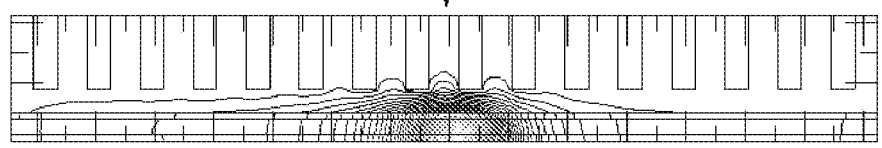

FIG. 21A shows is a simulation result of an isotherm when the material of the core portion of the memory pillar in the semiconductor storage device according to the first embodiment is $SiO_2$ and the diameter $D_{MH}$ of the memory hole MH is 70 nm. FIG. 21B shows a simulation result of an isotherm when the material of the core portion is air @1700K, and FIG. 21C shows a simulation result of an isotherm when the material of the core portion is air @300K.

From the simulation results of isotherms illustrated in FIGS. 19 to 21, it can be observed that the density of the isotherm near the selected memory cell MC tends to be high, and the peak temperature tends to be high. When the core portion is $SiO_2$, the temperature distribution to the core portion is spread out quite a bit. When the material of the core portion is air, the temperature distribution to the core portion is spread out less because it is prevented by the high thermal resistance of the core portion. When the material of the core portion is air @1700K, the peak temperature increases relative to air @300K, and thus the temperature distribution to the core portion is spread out more compared with the case of air @300K. In addition, as the diameter $D_{MH}$ of the memory hole MH is reduced from 120 nm, to 100 nm, and to 70 nm, the density of the isotherm becomes higher near the selected memory cell MC, and the peak temperature becomes higher, and the heat confinement effect becomes higher.

Effect of First Embodiment

According to the first embodiment, by employing any one of an insulator having a high thermal resistance, vacuum, or inert gas to the core portion, the heat generation temperature in the memory cell is increased, and also the localization of the heat generation portion is improved, so that the disturbance to the adjacent memory cells (that may cause data destruction in the adjacent memory cells) can be reduced.

Second Embodiment (Structure of Memory Cell)

An example of the cross-sectional structure of the memory pillar MP of the semiconductor storage device according to the second embodiment is described.

FIG. 22 is an example of the cross-sectional structure of the three-dimensionally stacked memory pillar MP in the semiconductor storage device according to the second embodiment. As illustrated in FIG. 22, the memory pillar MP includes, for example, the conductor layers 22.

The memory pillar MP has a columnar shape extending in the Z direction and penetrates the conductor layers 22. The memory pillar MP includes, for example, the core portion 30, an insulator layer 34, the variable resistance layer 31, the semiconductor layer 32, and the insulator layer 33. Specifically, the memory hole MH penetrating the stacked structure of the conductor layers 22 and the insulator layers 35 is provided. The memory hole MH has a cylindrical shape, for example, extending in the Z direction. The diameter $D_{MH}$ of the memory hole MH is as illustrated in FIG. 22. The memory pillar MP includes the insulator layer 33, the semiconductor layer 32, the variable resistance layer 31, the insulator layer 34, and the core portion 30, which are stacked sequentially in that order from the inside (inner wall) of the memory hole MH. Specifically, the memory pillar MP includes the cylindrical insulator layer 33 that covers the inner wall of the memory hole MH and extends in the Z direction, the cylindrical semiconductor layer 32 that covers the inner wall of the insulator layer 33 and extends in the Z direction, the cylindrical variable resistance layer 31 that covers the inner wall of the semiconductor layer 32 and extends in the Z direction, and the cylindrical insulator layer 34 that covers the inner wall of the variable resistance layer 31 and extends in the Z direction.

By forming the thin insulator layer 34 between the core portion 30 and the variable resistance layer 31, melting of the variable resistance layer 31 can be prevented. The thickness of the insulator layer 34 is, for example, about several nanometers to several tens of nanometers, and preferably about 2 nm to 5 nm. The insulator layer 34 may be an insulating film, and for example, $SiO_2$, $Si_3N_4$, and $HfO_2$ may be used. For example, if GST ($Ge_2Sb_2Te_5$) is used as the variable resistance layer 31, when data is written to GST, GST may be melted. The melting temperature of GST ($Ge_2Sb_2Te_5$) is lower than the fusing point of the insulator layer 34. Therefore, the melting of the variable resistance layer 31 is prevented, and the operation stability and the reliability can be improved. The other configurations are the same as those in the first embodiment.

(Structure of Memory Cell Array 110)

Hereinafter, an example of the cross-sectional structure of the memory cell array 110 in the semiconductor storage device according to the second embodiment is described.

Figure 23:
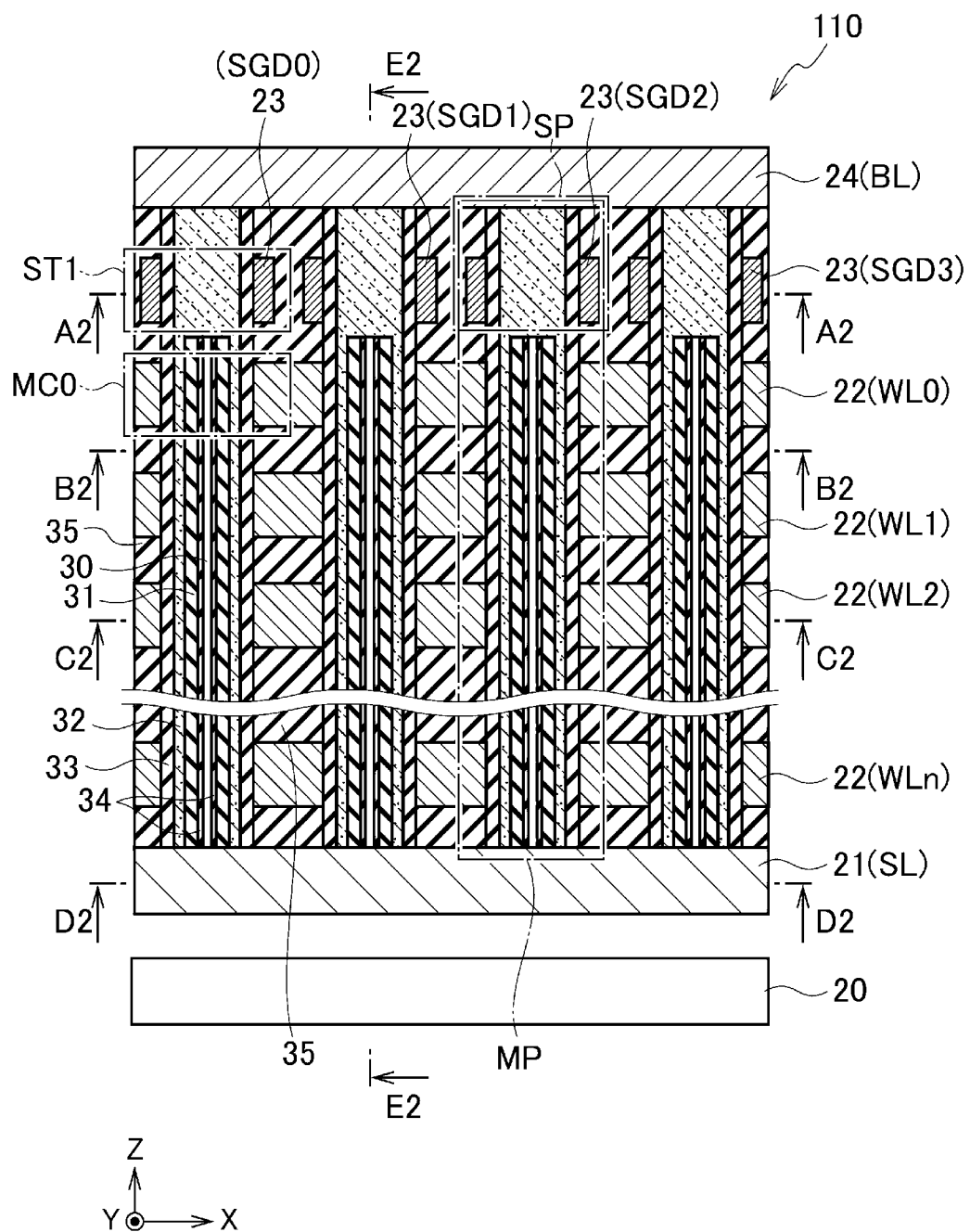
FIG. 23 is a cross-sectional view of the memory cell array of the semiconductor storage device according to the second embodiment.

FIG. 23 illustrates an example of the cross-sectional structure of the memory cell array 110 in the semiconductor storage device according to the second embodiment. As illustrated in FIG. 23, the memory cell array 110 includes, for example, the conductor layers 21 to 24. The conductor layers 21 to 24 are provided over the semiconductor substrate 20.

The memory pillar MP has a columnar shape extending along the Z direction and penetrates the conductor layers 22, so that the bottom portion reaches the conductor layer 21. The memory pillar MP includes, for example, the core portion 30, the insulator layer 34, the variable resistance layer 31, the semiconductor layer 32, and the insulator layer 33. Specifically, the memory hole MH penetrates the stacked structure of the conductor layers 22 and the insulator layers so that the bottom portion thereof reaches the conductor layer 21. The memory hole MH has a cylindrical shape, for example, extending in the Z direction. The memory pillar MP includes the insulator layer 33, the semiconductor layer 32, the variable resistance layer 31, the insulator layer 34, and the core portion 30, which are stacked sequentially in that order from the inside (inner wall) of the memory hole MH. Specifically, the memory pillar MP includes the cylindrical insulator layer 33 that covers the inner wall of the memory hole MH and extends in the Z direction, the cylindrical semiconductor layer 32 that covers the inner wall of the insulator layer 33 and extends in the Z direction, the cylindrical variable resistance layer 31 that covers the inner wall of the semiconductor layer 32 and extends in the Z direction, and the cylindrical insulator layer 34 that covers the inner wall of the variable resistance layer 31 and extends in the Z direction.

The bottom portions of the core portion 30, the insulator layer 34, the variable resistance layer 31, the semiconductor layer 32, and the insulator layer 33 of the memory pillar MP are in contact with the conductor layer 21. The other configurations are the same as those in the first embodiment.

Figure 24:
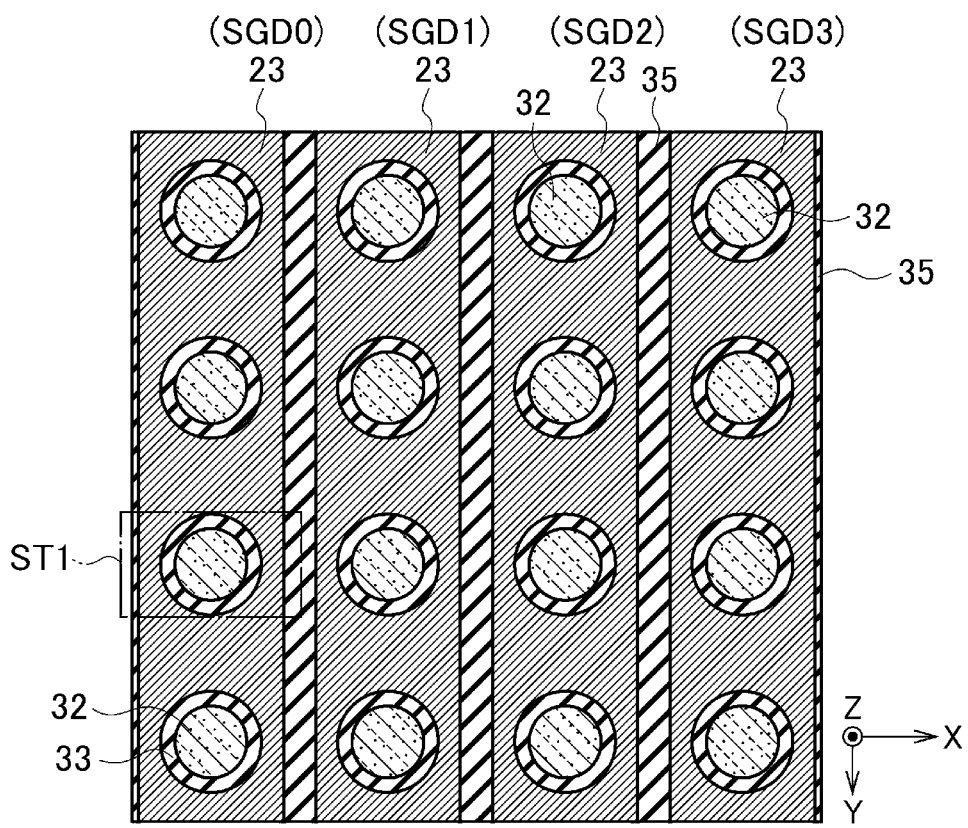
FIG. 24 illustrates a cross-section taken along line A2-A2 in FIG. 23.

Subsequently, the plane pattern configuration of the conductor layer 23 is described with reference to FIG. 24. FIG. 24 illustrates a cross-section taken along line A2-A2 in FIG. 23.

As illustrated in FIG. 24, the insulator layer 33 and the semiconductor layer 32 are provided in the SGD hole SH that penetrates the conductor layer 23. Also, the conductor layer 23 functions as the gate lines SGD0 to SGD3 of the select transistor ST1, and the insulator layer 33 functions as the gate insulating film of the select transistor ST1, and the semiconductor layer 32 functions as the semiconductor layer of the select transistor ST1. The memory pillar MP can be selected for each word line by using this select transistor ST1. By causing the select transistor ST1 to go into an on state, an inversion layer is formed on the semiconductor layer 32 that is in contact with the variable resistance layer 31 of the memory pillar MP, and the memory pillar MP can be selected by flowing the current via the inversion layer.

Subsequently, the plane pattern configuration between the memory cells MC in the Z direction is described with reference to FIG. 25.

Figure 25:
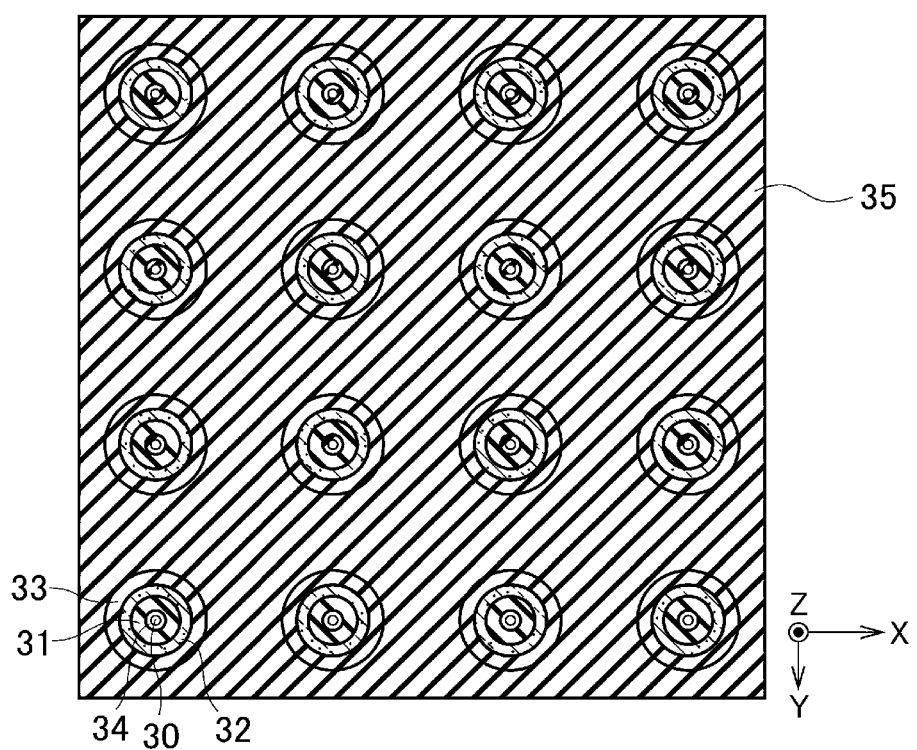
FIG. 25 illustrates a cross-section taken along line B2-B2 in FIG. 23.

FIG. 25 illustrates a cross-section taken along line B2-B2 in FIG. 23. The core portion 30, the insulator layer 34, the variable resistance layer 31, the semiconductor layer 32, and the insulator layer 33 illustrated in FIG. 25 form parts of the memory cells MC in the Z direction, and the current flows in the semiconductor layer 32.

Figure 26:
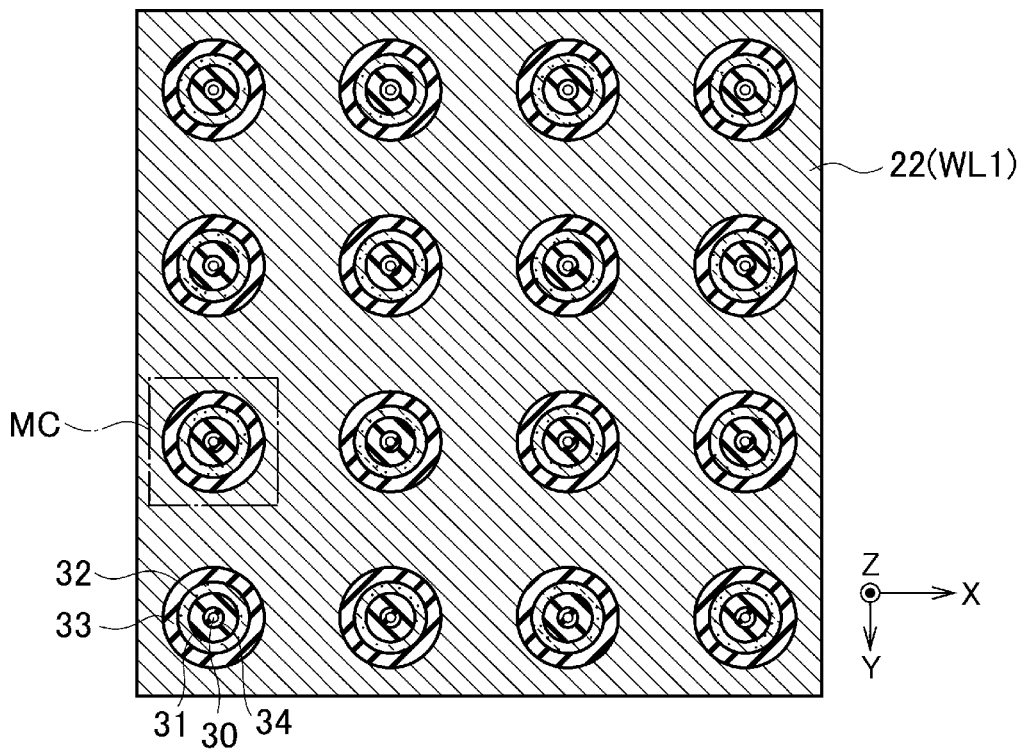
FIG. 26 illustrates a cross-section taken along line C2-C2 in FIG. 23.
Figure 27:
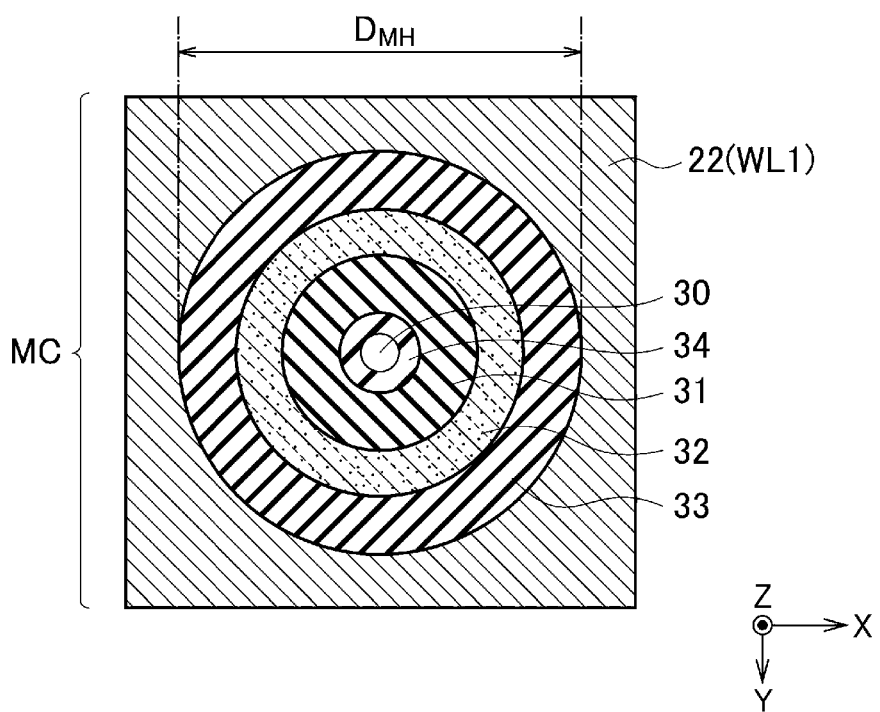
FIG. 27 is a plan view of one memory cell in the semiconductor storage device according to the second embodiment.

Subsequently, the plane pattern configuration of the conductor layers 22 is described with reference to FIGS. 26 and 27. FIG. 26 illustrates a cross-section taken along line C2-C2 in FIG. 23. FIG. 27 is a plan view of one memory cell MC.

As illustrated in FIG. 27, the memory cell MC is provided at an intersection between the plate-shaped word line WL and the memory pillar MP. Specifically, as illustrated in FIG. 27, the insulator layer 33, the semiconductor layer 32, the variable resistance layer 31, the insulator layer 34, and the core portion 30 are provided in the memory hole MH penetrating the conductor layer 22 and having the diameter $D_{MH}$. Also, the conductor layer 22 functions as the word line WL of the selector SW of the memory cell MC, the insulator layer 33 functions as a gate insulating film of the selector SW of the memory cell MC, and the semiconductor layer 32 functions as the semiconductor layer of the selector SW of the memory cell MC. The variable resistance layer 31 functions as the storage element MR of the memory cell MC. The insulator layer 34 functions as an insulating film that prevents melting of the variable resistance layer 31.

Subsequently, the plane pattern configuration of the conductor layer 21 is described. The cross-section taken along line D2-D2 in FIG. 23 is shown in the same manner as in FIG. 11.

The conductor layer 21 has a plate shape and is set to a constant low voltage in order to cause the current to flow from the bit lines BL. As illustrated in FIG. 11, the conductor layer 21 (source line) has a plate shape in the same manner as the conductor layer 22 (word line).

Figure 28:
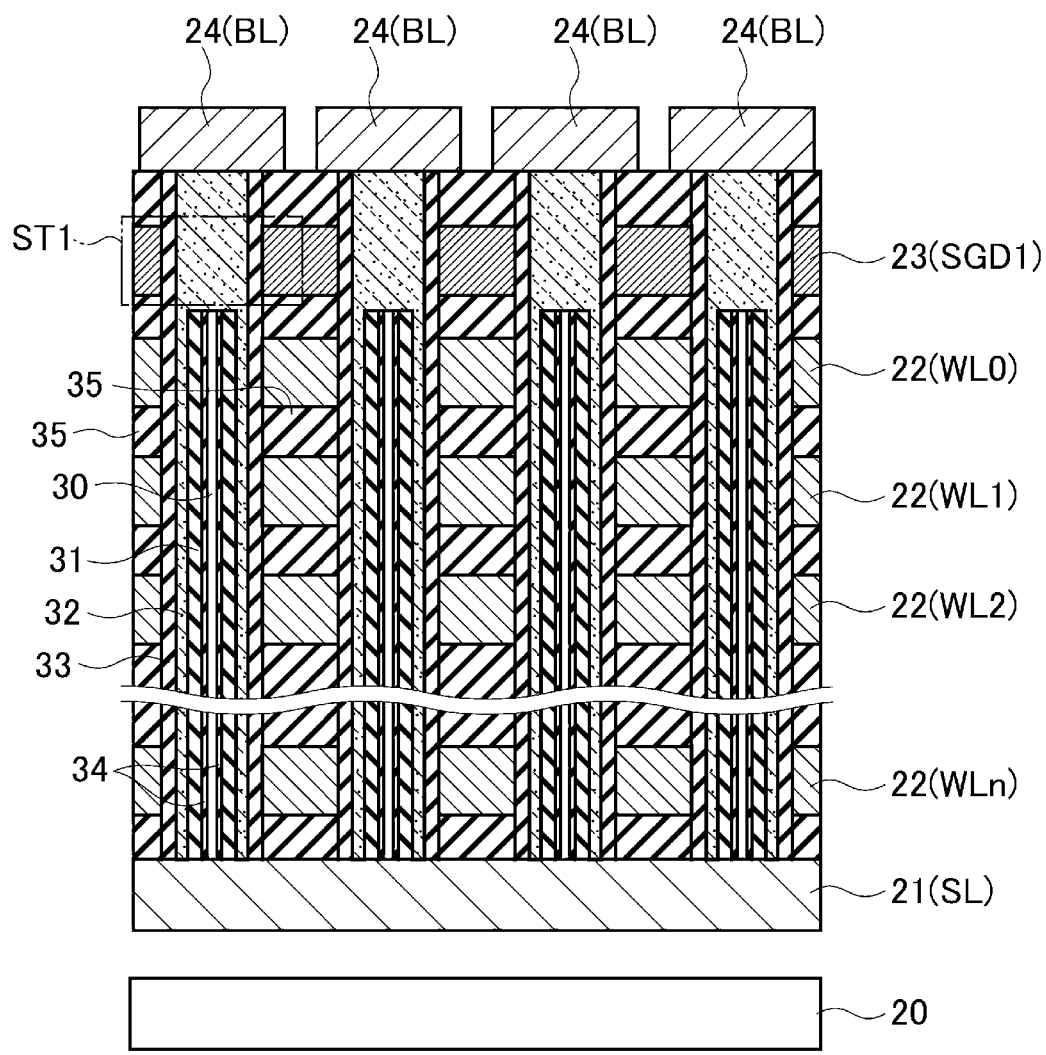
FIG. 28 illustrates a cross-section taken along line E2-E2 in FIG. 23.

Subsequently, an example of the cross-sectional structure of the memory cell array 110 is described with reference to FIG. 28. FIG. 28 illustrates a cross-section taken along line E2-E2 in FIG. 23. FIG. 28 is a cross section in a direction orthogonal to FIG. 23. FIG. 28 corresponds to a structure in which four of the memory pillars MP illustrated in FIG. 22 are located in the Y direction. It is noted that the number of the memory pillars MP is not limited to four. With reference to FIGS. 23 and 28, it can be understood that the memory pillar MP has a concentric shape about the core portion 30.

Effect of Second Embodiment

According to the second embodiment, since the insulator layer is further provided between the core portion and the variable resistance layer, the melting of the variable resistance layer into the core portion can be prevented, and it is possible to provide the semiconductor storage device having a three-dimensional structure with excellent operation stability and excellent reliability.

In the second embodiment, by employing any one of an insulator having a high thermal resistance, vacuum, or inert gas to the core portion, the heat generation temperature in the memory cell is increased, and also the localization of the heat generation portion is improved, so that the disturbance to the adjacent memory cells (that may cause data destruction in the adjacent memory cells) can be reduced.

Third Embodiment (Structure of Memory Cell)

An example of the cross-sectional structure of the memory pillar MP of a semiconductor storage device according to a third embodiment is described.

Figure 29:
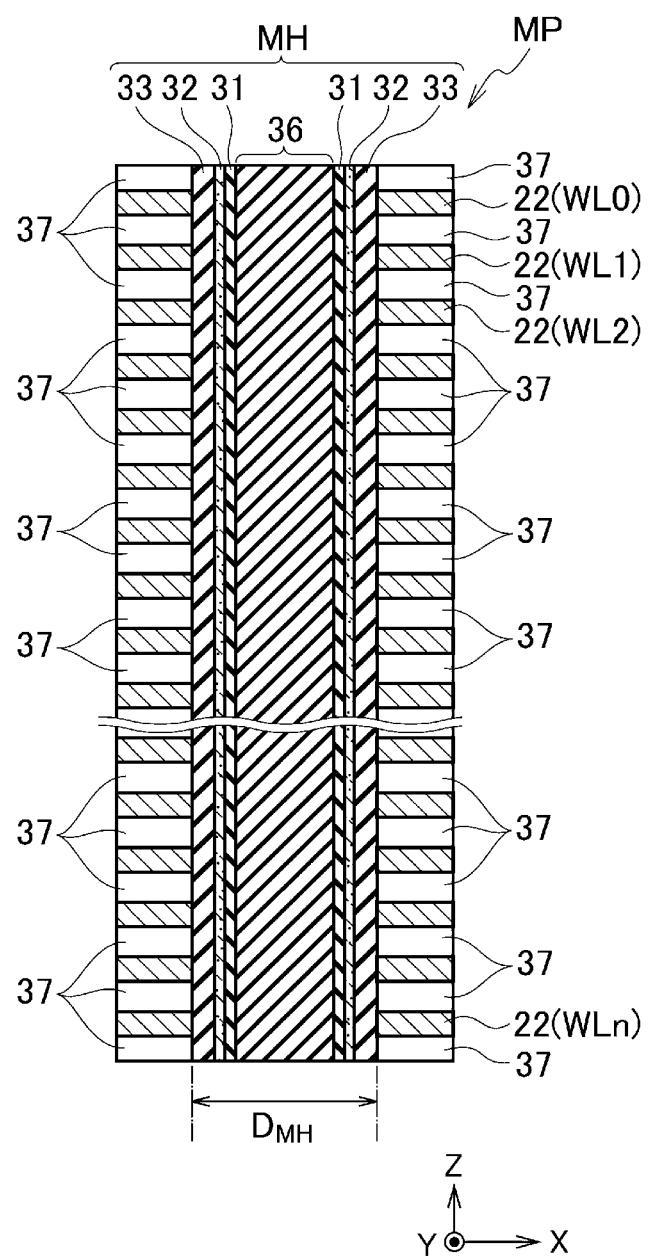
FIG. 29 is a cross-sectional view of a memory pillar in the semiconductor storage device according to a third embodiment.

FIG. 29 illustrates an example of the cross-sectional structure of the three-dimensionally stacked memory pillar MP in the semiconductor storage device according to the third embodiment. As illustrated in FIG. 29, the memory pillar MP includes, for example, the conductor layers 22.

Conductor interlayer portions 37 and the conductor layers (voltage applying electrode) 22 are alternately stacked. The conductor layer 22 is formed in a plate shape, for example, expanding along the X-Y plane. For example, the plurality of stacked conductor layers 22 are used as the word lines WLn to WL0, respectively. The conductor layer 22 includes, for example, tungsten (W). The conductor interlayer portions 37 are located between the conductor layers 22 adjacent to each other in the Z direction.

The memory pillar MP has a columnar shape extending in the Z direction and penetrates the conductor layers 22 and the conductor interlayer portions 37. The memory pillar MP includes, for example, a core portion 36, the variable resistance layer 31, the semiconductor layer 32, and the insulator layer 33. Specifically, the memory hole MH penetrating the stacked structure of the conductor layers 22 and the conductor interlayer portions 37 is provided. The memory hole MH has a cylindrical shape, for example, extending in the Z direction. The diameter $D_{MH}$ of the memory hole MH is as illustrated in FIG. 29. The memory pillar MP includes the insulator layer 33, the semiconductor layer 32, the variable resistance layer 31, and the core portion 36, which are stacked sequentially in that order from the inside (inner wall) of the memory hole MH. Specifically, the memory pillar MP includes the cylindrical insulator layer 33 that covers the inner wall of the memory hole MH and extends in the Z direction, the cylindrical semiconductor layer 32 that covers the inner wall of the insulator layer 33 and extends in the Z direction, and the cylindrical variable resistance layer 31 that covers the inner wall of the semiconductor layer 32 and extends in the Z direction.

The insulator having a high thermal resistance, vacuum, inert gas or air may be employed as the conductor interlayer portions 37.

When an insulator having a high thermal resistance is formed in the conductor interlayer portion 37, the high packing property is preferable, and simultaneously the mechanical strength can be allocated between the conductor layers 22.

When the conductor interlayer portions 37 are removed to form a vacuum region, the degree of vacuum may be in the ranges of $10^5$ Pa to $10^2$ Pa at low vacuum, $10^2$ Pa to $10^{-1}$ Pa at medium vacuum, $10^{-1}$ Pa to $10^{-5}$ Pa at high vacuum, and $10^{-5}$ Pa to $10^{-8}$ Pa at ultra-high vacuum.

When the conductor interlayer portions 37 are inert gas, for example, a rare gas such as helium, neon, argon, krypton, xenon, radon, or oganesson, or a nitrogen gas may be used.

By employing an insulator having a high thermal resistance, vacuum, inert gas or air to the conductor interlayer portions 37, the heat insulating effect can be raised compared with a case where $SiO_2$ is applied. By employing any one of an insulator having a high thermal resistance, vacuum, or inert gas to the conductor interlayer portions 37, the capacitance between the conductor layers (voltage applying electrodes) 22 can be reduced compared with a case where the insulator is applied, and the operation speed of the memory cell can be improved. For example, by employing air as the conductor interlayer portions 37, compared with a case of employing $SiO_2$, the capacitance between the conductor layers (voltage applying electrodes) 22 can be reduced by about ¼ from the difference of values of the relative permittivity.

The core portion 36 has, for example, a columnar shape extending in the Z direction. An insulating layer such as $SiO_2$ and SiN may be employed as the core portion 36. In addition, for example, a material with higher thermal resistance than $SiO_2$ may be employed as the core portion 36. For example, vacuum or inert gas may be employed as the core portion 36.

The degree of vacuum in case of employing a vacuum region as the core portion 36 may be in the same range as in the first embodiment.

When the core portion 36 is an inert gas, for example, a rare gas such as helium, neon, argon, krypton, xenon, radon, or oganesson, or a nitrogen gas may be used. The thickness of the variable resistance layer 31 is, for example, 20 nm or less. The diameter of the core portion 30 is larger than the thickness of the variable resistance layer 31, and may be, for example, several tens of nanometers or more.

By employing an insulator having a high thermal resistance, vacuum, or inert gas as the core portion 36, the heat generation temperature in the memory element can be increased. Further, the localization of the heat generation portion is improved, so that the disturbance to the adjacent memory cells (that may cause data destruction in the adjacent memory cells) can be reduced.

In the same manner as in the second embodiment, the thin insulator layer 34 between the core portion 36 and the variable resistance layer 31 is formed so that the melting of the variable resistance layer 31 can be prevented. The other configurations are the same as those in the first embodiment.

(Structure of Memory Cell Array 110)

Subsequently, an example of the cross-sectional structure of the memory cell array 110 of the semiconductor storage device according to the third embodiment is described.

Figure 30:
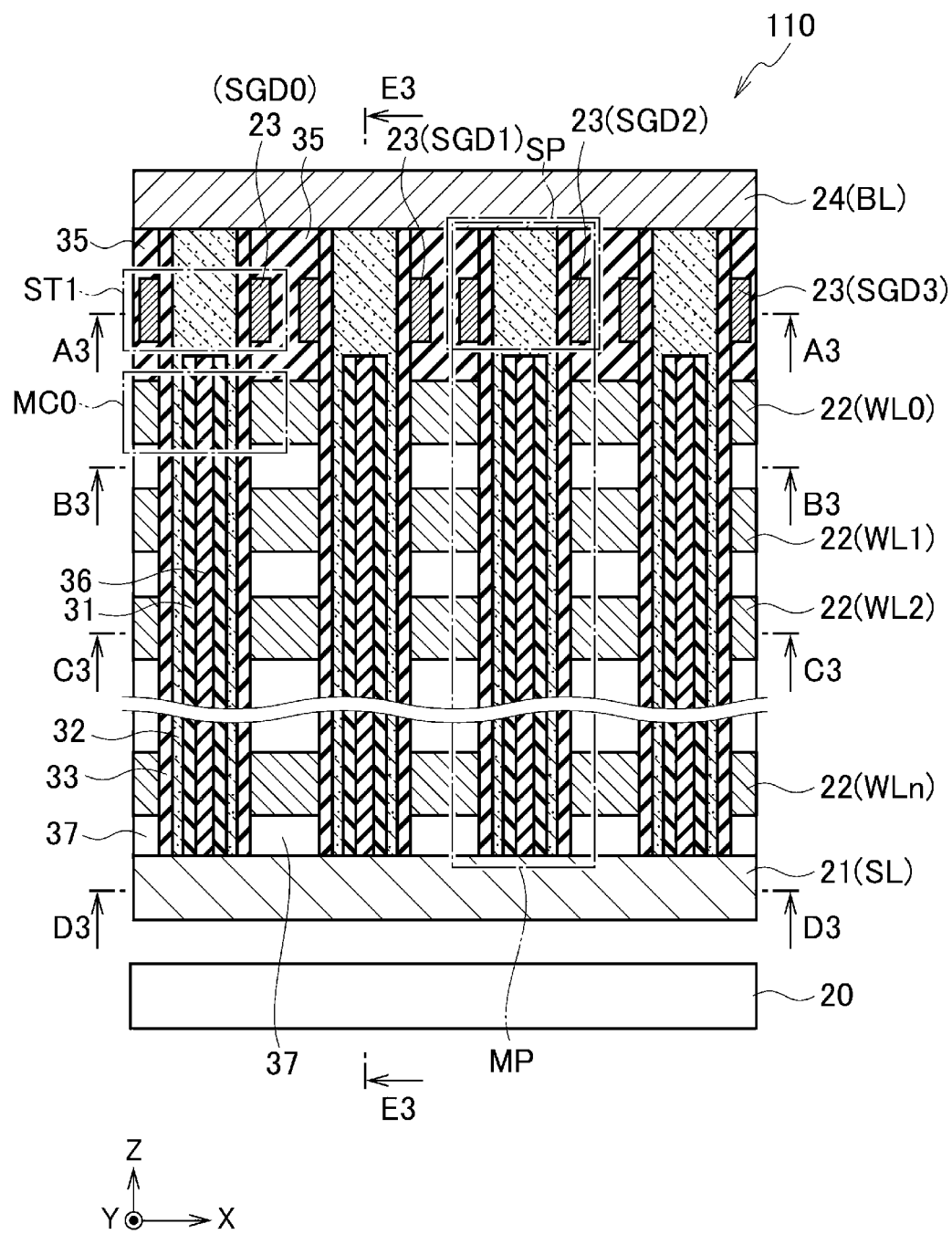
FIG. 30 is a cross-sectional view of the memory cell array of the semiconductor storage device according to the third embodiment.

FIG. 30 illustrates an example of the cross-sectional structure of the memory cell array 110 in the semiconductor storage device according to the third embodiment. As illustrated in FIG. 30, the memory cell array 110 includes, for example, the conductor layers 21 to 24. The conductor layers 21 to 24 are provided over the semiconductor substrate 20.

The conductor interlayer portions 37 and the conductor layers (voltage applying electrodes) 22 are alternately stacked in the Z direction of the conductor layer 21. The conductor layer 22 is formed in a plate shape, for example, expanding along the X-Y plane. For example, the plurality of stacked conductor layers 22 are used as the word lines WLn to WL0, respectively, in an order from the semiconductor substrate 20 side.

The memory pillar MP has a columnar shape extending along the Z direction and penetrates the conductor layers 22 and the conductor interlayer portions 37, so that the bottom portion reaches the conductor layer 21. The memory pillar MP includes, for example, the core portion 36, the variable resistance layer 31, the semiconductor layer 32, and the insulator layer 33. Specifically, the memory hole MH penetrates the stacked structure of the conductor layers 22 and the conductor interlayer portions 37 so that the bottom portion thereof reaches the conductor layer 21. The memory hole MH has a cylindrical shape extending, for example, in the Z direction. The memory pillar MP includes the insulator layer 33, the semiconductor layer 32, the variable resistance layer 31, and the core portion 36, which are stacked sequentially in that order from inside (inner wall) of the memory hole MH. Specifically, the memory pillar MP includes the cylindrical insulator layer 33 that covers the inner wall of the memory hole MH and extends in the Z direction, the cylindrical semiconductor layer 32 that covers the inner wall of the insulator layer 33 and extends in the Z direction, and the cylindrical variable resistance layer 31 that covers the inner wall of the semiconductor layer 32 and extends in the Z direction.

The bottom portions of the core portion 36, the variable resistance layer 31, the semiconductor layer 32, and the insulator layer 33 of the memory pillar MP are in contact with the conductor layer 21. The other configurations are the same as those in the first embodiment.

Figure 31:
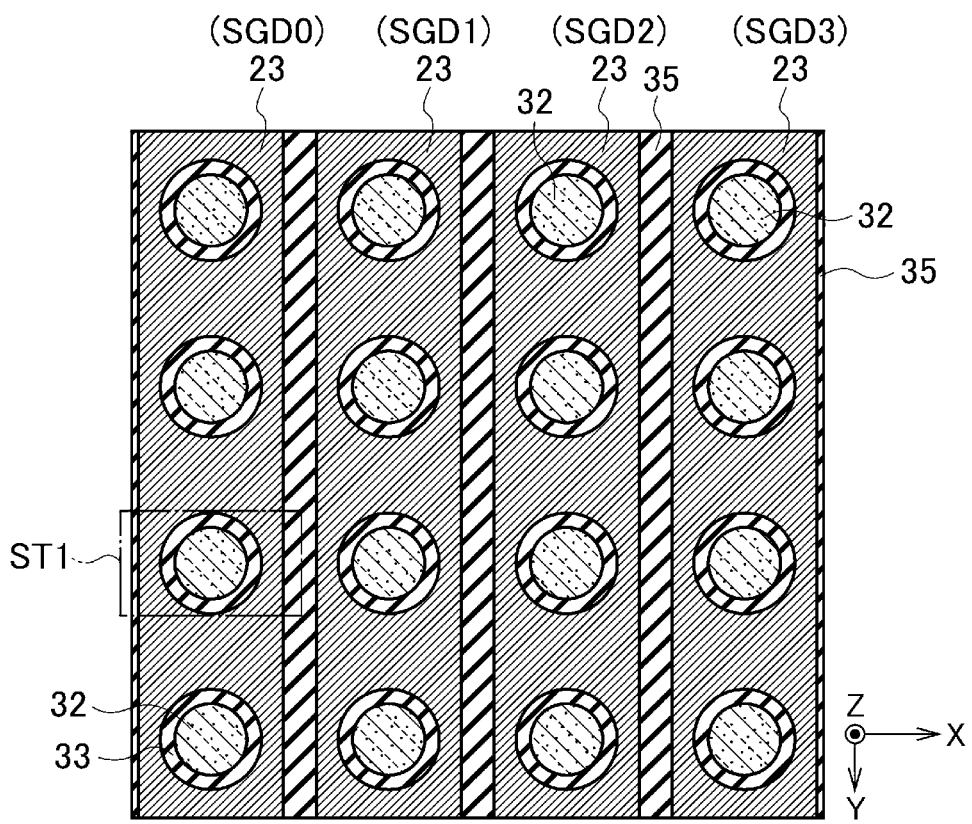
FIG. 31 illustrates a cross-section taken along line A3-A3 in FIG. 30.

Subsequently, the plane pattern configuration of the conductor layer 23 is described with reference to FIG. 31. FIG. 31 illustrates a cross-section taken along line A3-A3 in FIG. 30.

As illustrated in FIG. 31, the insulator layer 33 and the semiconductor layer 32 are provided in the SGD hole SH that penetrates the conductor layer 23. Also, the conductor layer 23 functions as the gate lines SGD0 to SGD3 of the select transistor ST1, and the insulator layer 33 functions as the gate insulating film of the select transistor ST1, and the semiconductor layer 32 functions as the semiconductor layer of the select transistor ST1. The memory pillar MP can be selected for each word line by using this select transistor ST1. By causing the select transistor ST1 to go into an on state, an inversion layer is formed on the semiconductor layer 32 that is in contact with the variable resistance layer 31 of the memory pillar MP, and the memory pillar MP can be selected by flowing the current via the inversion layer.

Subsequently, the plane pattern configuration between the memory cells MC in the Z direction is described with reference to FIG. 32.

Figure 32:
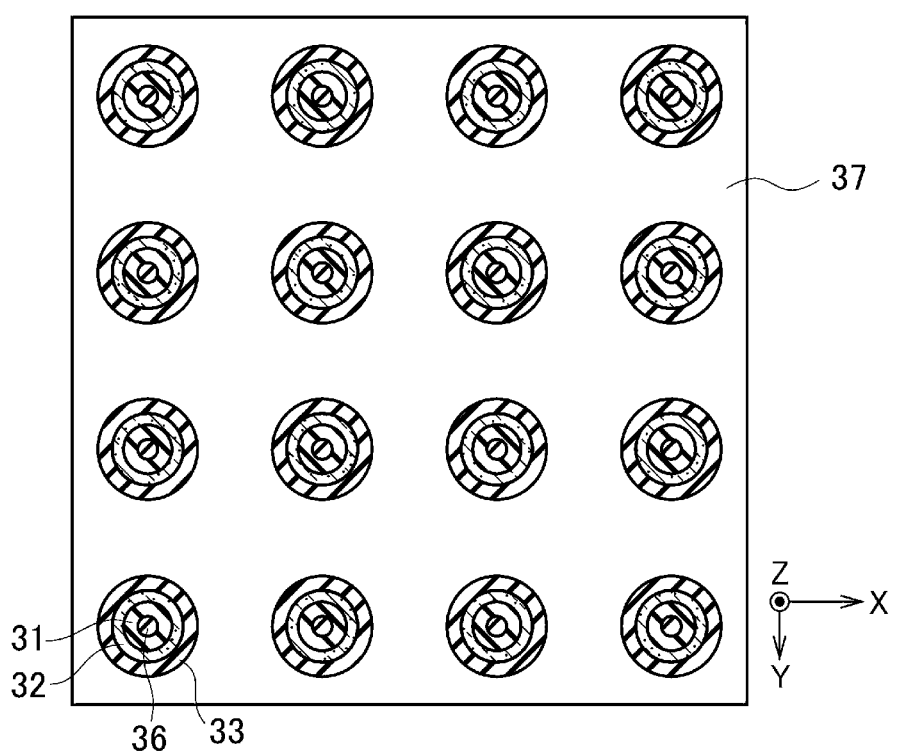
FIG. 32 illustrates a cross-section taken along line B3-B3 in FIG. 30.

FIG. 32 illustrates a cross-section taken along line B3-B3 in FIG. 30. The core portion 36, the variable resistance layer 31, the semiconductor layer 32, and the insulator layer 33 illustrated in FIG. 32 form parts of the memory cells MC in the Z direction, and the current flows in the semiconductor layer 32.

Figure 33:
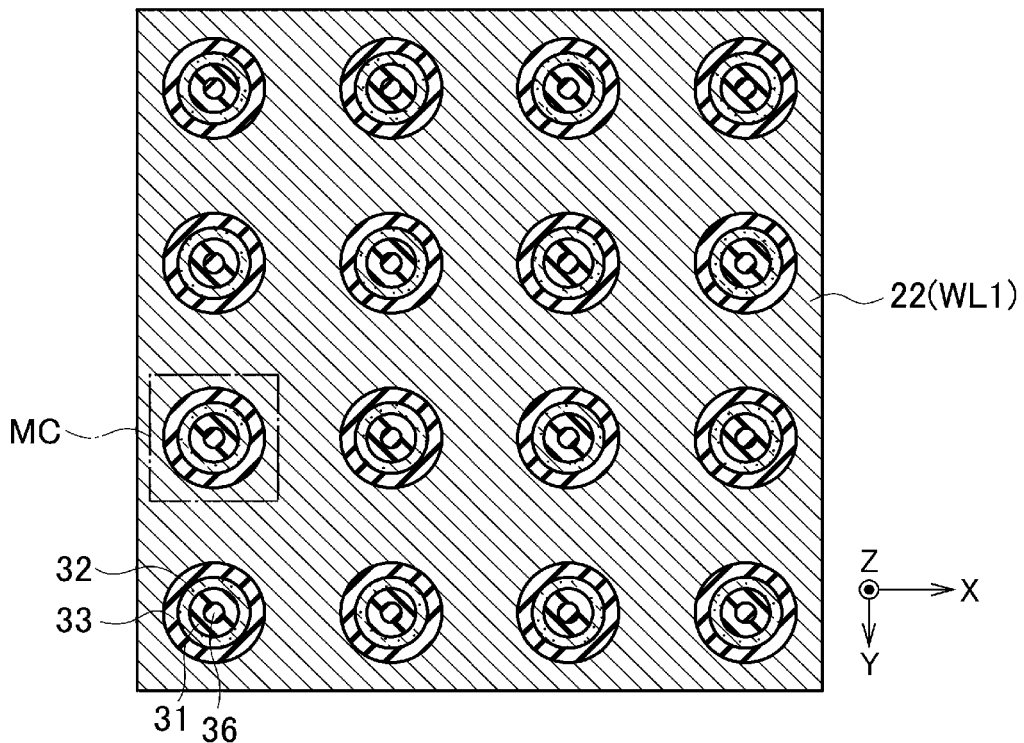
FIG. 33 illustrates a cross-section taken along line C3-C3 in FIG. 30.
Figure 34:
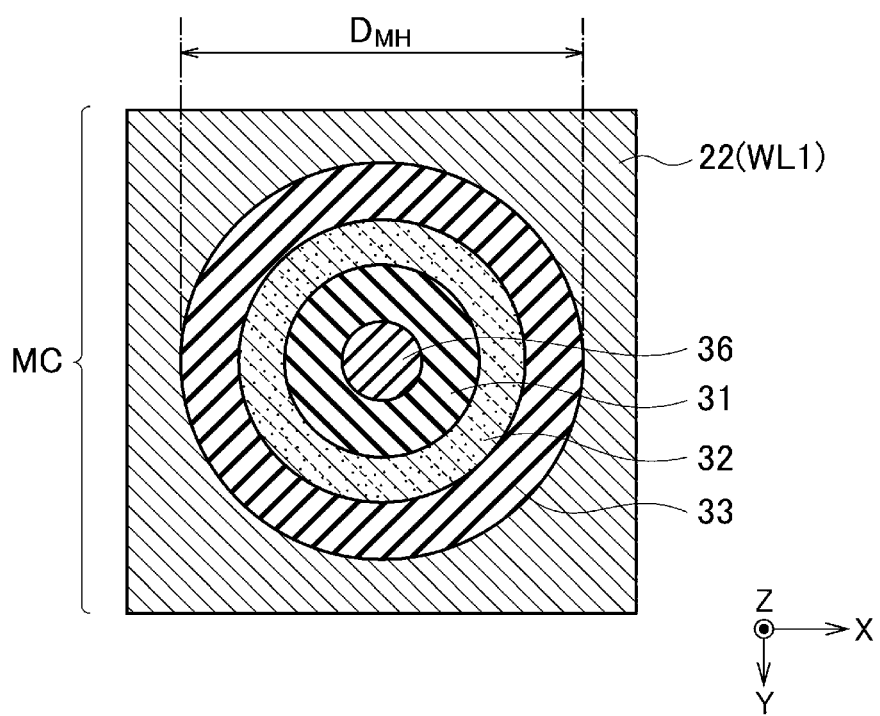
FIG. 34 is a plan view of one memory cell of the semiconductor storage device according to the third embodiment.

Subsequently, the plane pattern configuration of the conductor layers 22 is described with reference to FIGS. 33 and 34. FIG. 33 illustrates a cross-section taken along line C3-C3 in FIG. 30. FIG. 34 is a plan view of one memory cell MC.

As illustrated in FIG. 34, the memory cell MC is provided at an intersection between the plate-shaped word line WL and the memory pillar MP. Specifically, as illustrated in FIG. 34, the insulator layer 33, the semiconductor layer 32, the variable resistance layer 31, and the core portion 36 are provided in the memory hole MH penetrating the conductor layer 22 and having the diameter $D_{MH}$. Also, the conductor layer 22 functions as the word line WL of the selector SW of the memory cell MC, the insulator layer 33 functions as a gate insulating film of the selector SW of the memory cell MC, and the semiconductor layer 32 functions as the semiconductor layer of the selector SW of the memory cell MC.

The variable resistance layer 31 functions as the storage element MR of the memory cell MC.

Subsequently, the plane pattern configuration of the conductor layer 21 is described. The cross-section taken along line D3-D3 in FIG. 30 is shown in the same manner as in FIG. 11.

The conductor layer 21 has a plate shape and is set to a constant low voltage in order to cause the current to flow from the bit lines BL. As illustrated in FIG. 11, the conductor layer 21 (source line) has a plate shape in the same manner as the conductor layer 22 (word line).

Figure 35:
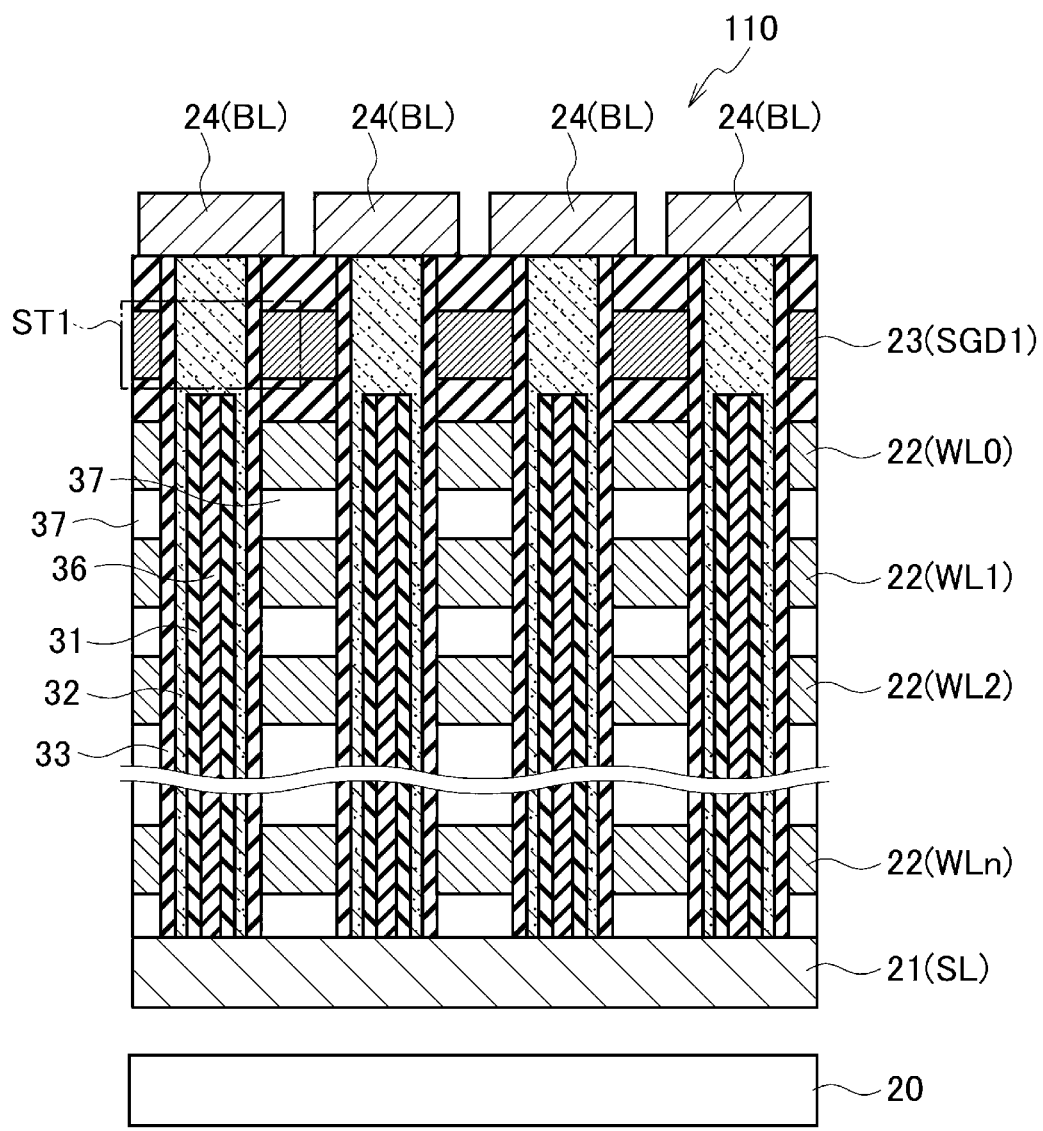
FIG. 35 illustrates a cross-section taken along line E3-E3 in FIG. 30.

Subsequently, an example of the cross-sectional structure of the memory cell array 110 is described with reference to FIG. 35. FIG. 35 illustrates a cross-section taken along line E3-E3 in FIG. 30. FIG. 35 is a cross section in a direction orthogonal to FIG. 30. With reference to FIGS. 30 and 35, it can be understood that the memory pillar MP has a concentric shape about the core portion 36.

(Simulation)

FIG. 36A is a view of a cross-sectional structure used for the simulation, in the semiconductor storage device according to the third embodiment. FIG. 36B shows a simulation result of peak temperatures (a.u.) for different materials of the conductor interlayer portion 37 between the conductor layers 22 (e.g., an insulating layer, air @1700K, and air @300K) in the Z direction near an area A of FIG. 36A, in the semiconductor storage device according to the third embodiment. In FIG. 36B, an intersection coordinate with an X axis on a Z axis is denoted as ZX. An effect in which the peak temperature difference ΔT changes for different materials of the conductor interlayer portion 37 in the semiconductor storage device according to the third embodiment is shown. Here, as the insulating layer of the conductor interlayer portion 37, $HfO_2$ is used. Compared with a case where the material of the conductor interlayer portion 37 is $HfO_2$, when the material thereof is air @1700K or air @300K, the peak temperature difference ΔT is very large. In order to increase the peak temperature, it is understood that a material with a comparatively high thermal resistance may be used for the material of the conductor interlayer portion 37.

(Thermal Resistance Equivalent Circuit)

Figures 37A, 37B:
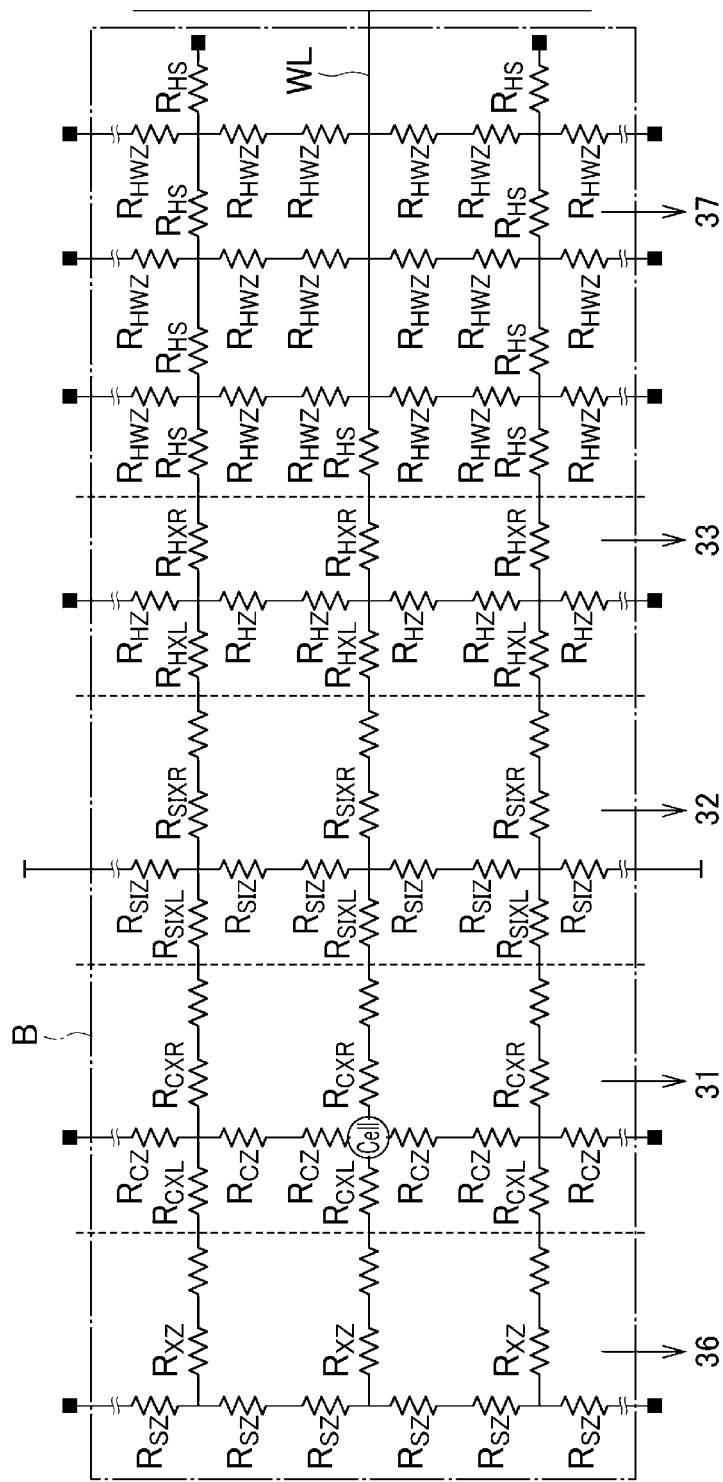
FIG. 37A is a cross-sectional view of a memory pillar in the semiconductor storage device according to the third embodiment.
FIG. 37B is a diagram of a thermal resistance equivalent circuit near an area B in FIG. 37A.
Figure 38:
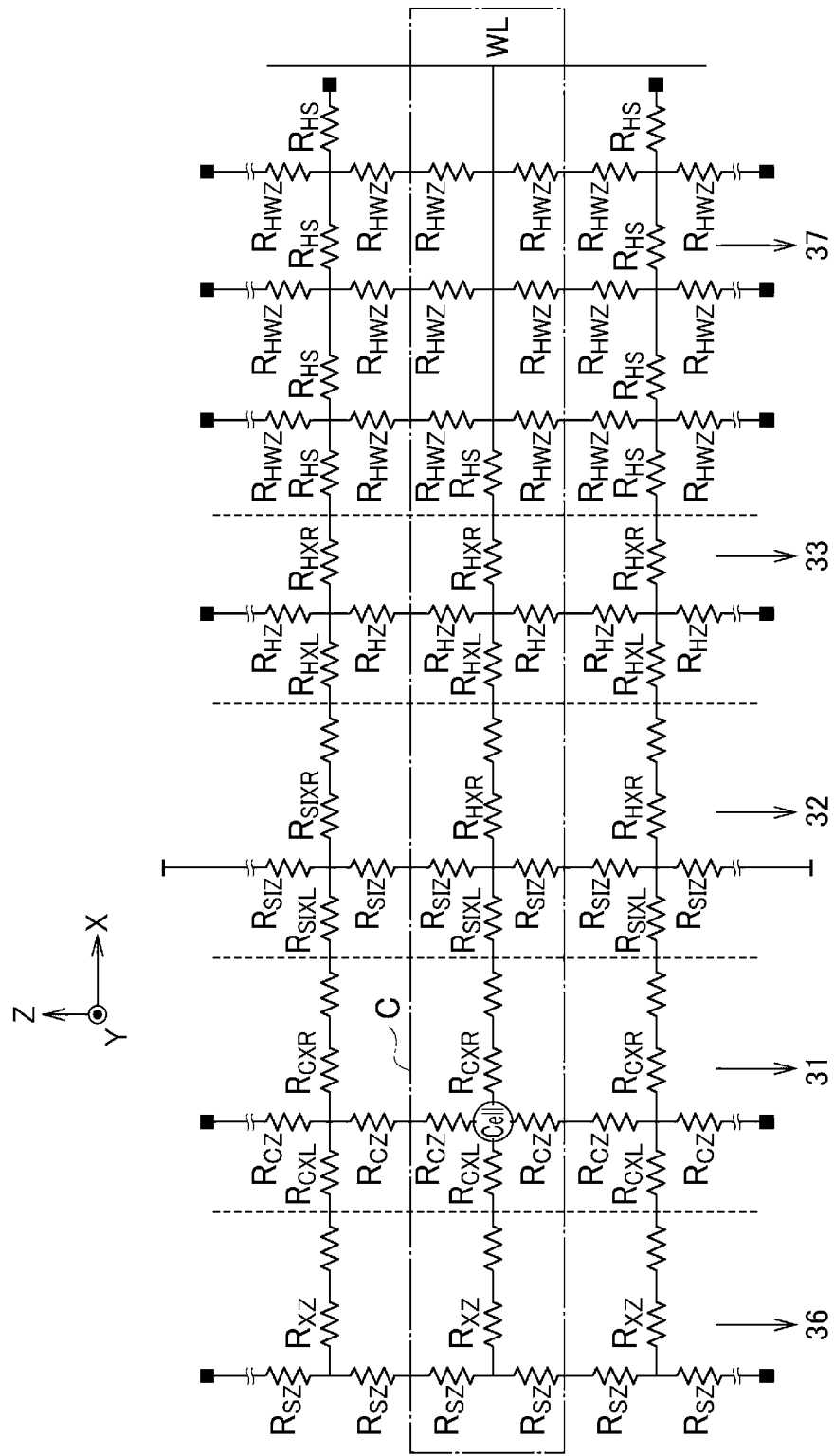
FIG. 38 is a diagram of a thermal resistance equivalent circuit corresponding to a portion of a word line near an area C of FIG. 37A in the semiconductor storage device according to the third embodiment.

FIG. 37A is a cross-sectional view of a memory pillar in the semiconductor storage device according to the third embodiment. FIG. 37B is a diagram of a thermal resistance equivalent circuit near an area B in FIG. 37A. FIG. 38 is a diagram of a thermal resistance equivalent circuit near an area C corresponding to a portion of the word line WL in FIG. 37A.

The core portion 36 is represented by thermal resistance components $R_{SZ}$ in the Z direction and thermal resistance components $R_{XZ}$ in the X direction. The variable resistance layer 31 is represented by thermal resistance components $R_{CZ}$ in the Z direction, thermal resistance components $R_{CXR}$ in the +X direction, and thermal resistance components $R_{CXL}$ in the −X direction about a memory cell depicted as Cell in FIG. 37B. The semiconductor layer 32 is represented by thermal resistance components $R_{SIZ}$ in the Z direction, thermal resistance components $R_{SIXR}$ in the +X direction, and thermal resistance components $R_{SIXL}$ in the −X direction. The insulator layer 33 is represented by thermal resistance components $R_{HZ}$ in the Z direction, thermal resistance components $R_{HXR}$ in the +X direction, and thermal resistance components $R_{HXL}$ in the −X direction. The conductor interlayer portion 37 is represented by thermal resistance components $R_{HWZ}$ in the Z direction and thermal resistance components $R_{HS}$ in the X direction.

Figure 39:
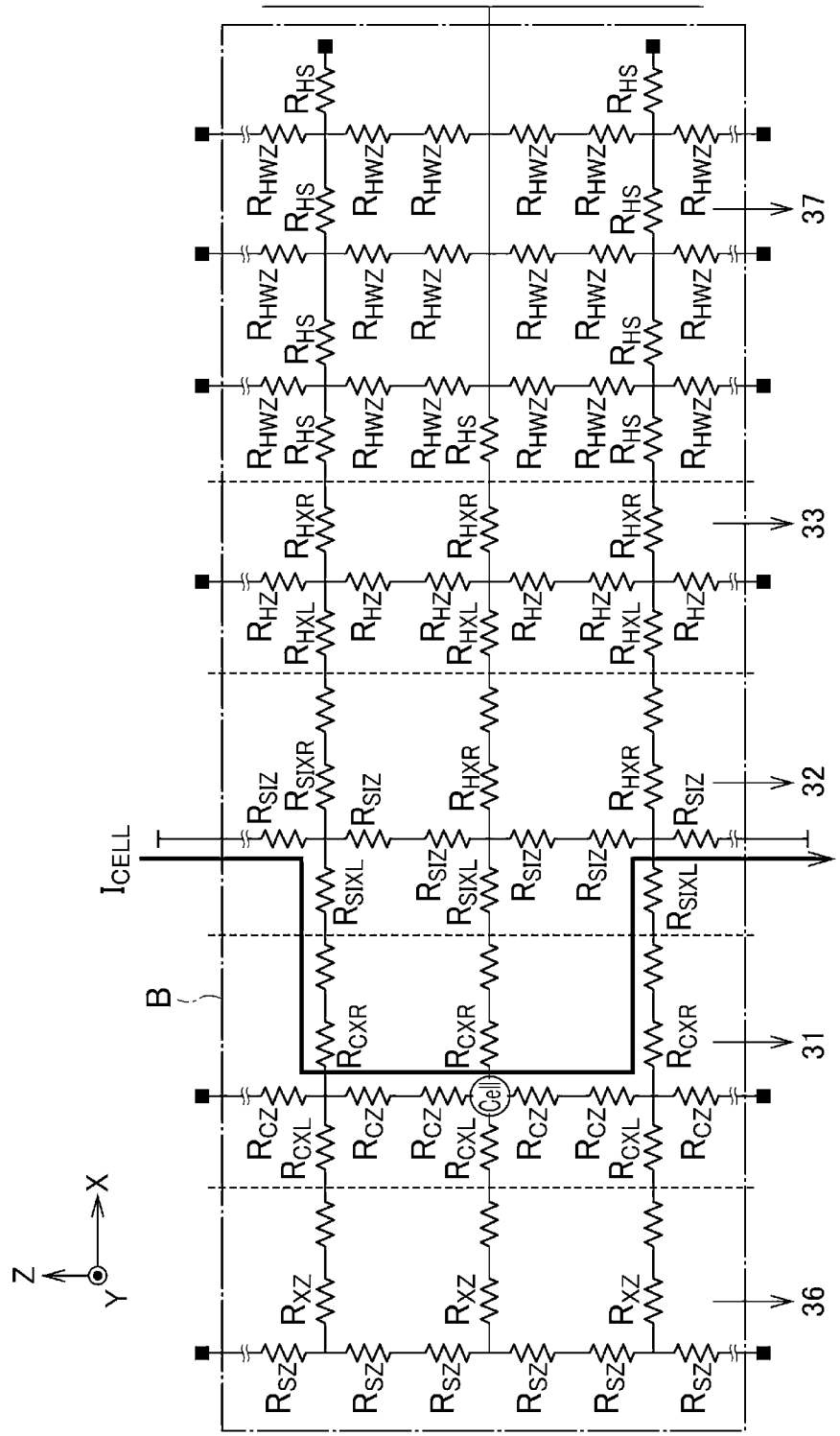
FIG. 39 is a diagram of the thermal resistance equivalent circuit of FIG. 38 in which a current path of a cell current is shown.

FIG. 39 is an explanatory view of a current path of the cell current $I_{CELL}$ in the thermal resistance equivalent circuit of the semiconductor storage device according to the third embodiment. When the memory cell Cell is not selected, the selector SW enters an on state (conductive state) to cause the cell current $I_{CELL}$ to flow through the semiconductor layer 32. However, when the memory cell Cell is selected, the selector SW enters an off state (non-conductive state) to cause the cell current $I_{CELL}$ to flow through the variable resistance layer 31 as illustrated in FIG. 39.

Figure 40:
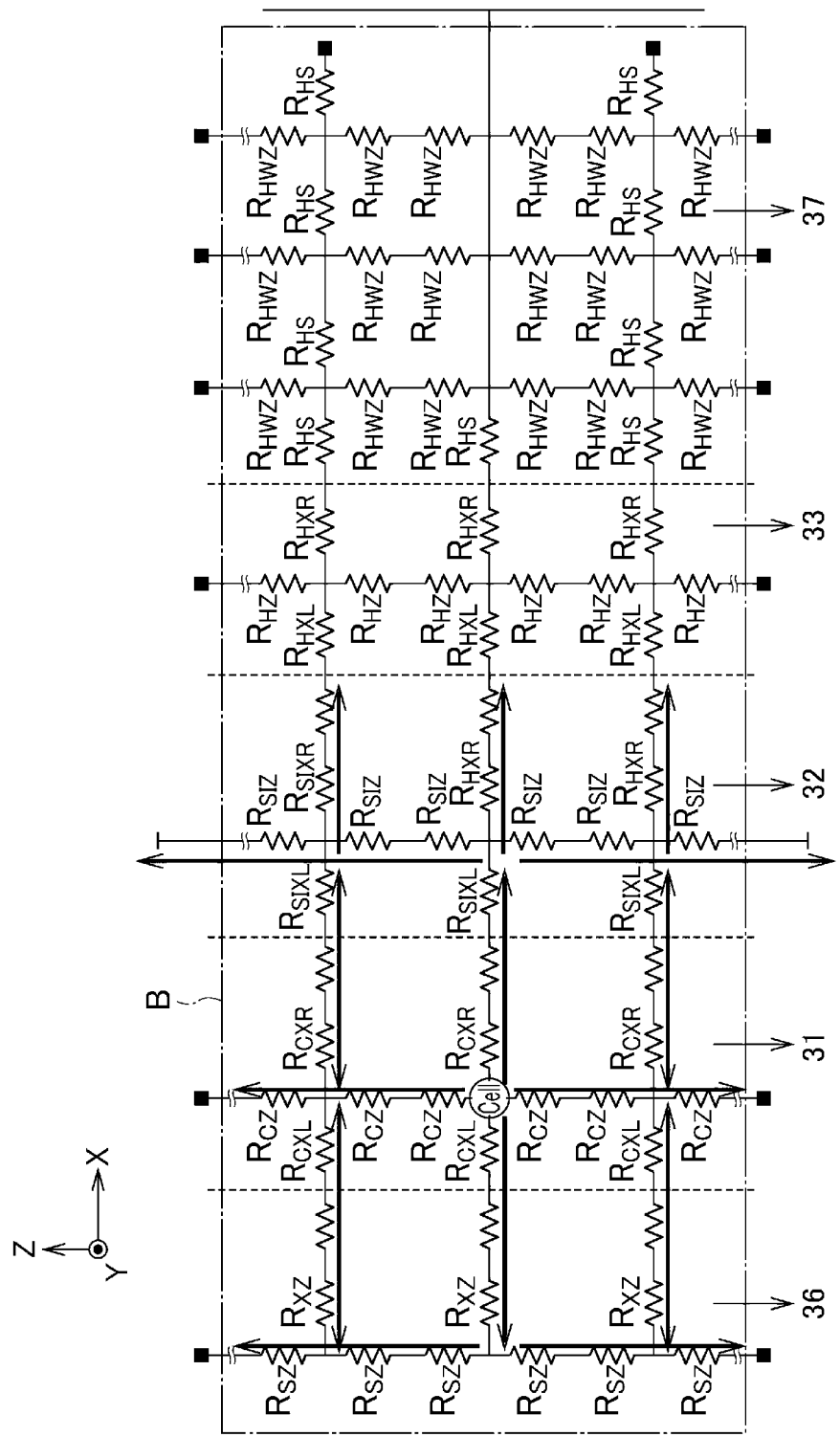
FIG. 40 is a diagram of the thermal resistance equivalent circuit of FIG. 38 in which heat dissipation path is shown.

FIG. 40 is an explanatory view of heat dissipation in the thermal resistance equivalent circuit of the semiconductor storage device according to the third embodiment. The heat generated in the memory cell Cell is conducted through the variable resistance layer 31 in the +Z direction and the −Z direction. The heat is also conducted from the variable resistance layer 31 to the semiconductor layer 32 in the +X direction. The heat is also conducted from the variable resistance layer 31 to the core portion 36 in the −X direction. The heat is also conducted through the semiconductor layer 32 in the +Z direction, the −Z direction, and the +X direction. The heat is also conducted through the core portion 36 in the +Z direction and the −Z direction. There is a path for transferring heat between the core portion 36 and the variable resistance layer 31. There is also a path for transferring heat between the semiconductor layers 32.

Figure 41:
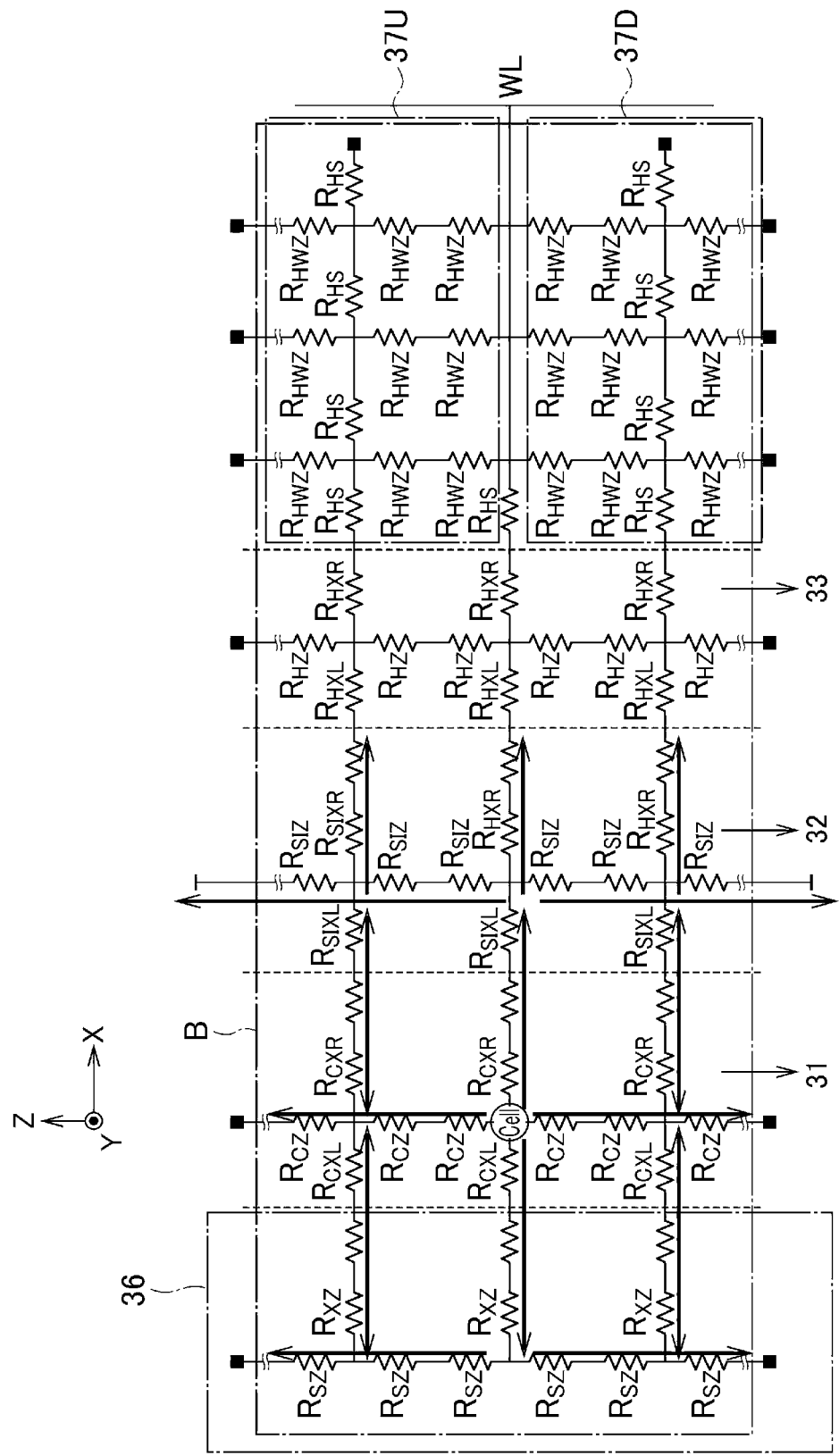
FIG. 41 is a diagram of the thermal resistance equivalent circuit of FIG. 38 in which heat dissipation path is shown for a case where the material of the core portion is removed to form a vacuum region a portion between the word lines is removed to form a vacuum region or replaced with air.

FIG. 41 is an explanatory view of heat dissipation in which the material of the core portion is removed to form a vacuum region to decrease thermal conductivity of the core portion and raise a thermal resistance and in which a portion between the word lines WL is removed to form a vacuum region or filled with air to prevent heat dissipation between the word lines WL in the semiconductor storage device according to the third embodiment. Since the core portion 36 is represented by the thermal resistance component $R_{SZ}$ in the Z direction and the thermal resistance component $R_{XZ}$ in the X direction, these values can be increased by removing the material of the core portion 36 to form a vacuum region.

By increasing the thermal resistance of the core portion 36, the dissipation of heat to the core portion 36 is prevented, so that the heat generation temperature in the variable resistance layer 31 is increased, and also the localization of the heat generation portion can be improved.

Conductor interlayer portions on and below the word line WL is denoted by 37U and 37D. The conductor interlayer portions 37U and 37D are represented by the thermal resistance components $R_{HWZ}$ in the Z direction and the thermal resistance components $R_{HS}$ in the X direction, and thus these values can be increased by removing the conductor interlayer portions 37U and 37D to form vacuum regions or replacing the conductor interlayer portions 37U and 37D with air. The conductor interlayer portions 37U and 37D can be removed to form a vacuum region or replaced with air between the word lines WL so that the dissipation to the conductor interlayer portions 37U and 37D between the word lines WL can be prevented.

Effect of Third Embodiment

According to the third embodiment, by employing any one of an insulator having a high thermal resistance, vacuum, or inert gas as the conductor interlayer portions 37 between the conductor layers 22, the heat insulating effect can be raised. By employing any one of an insulator having a high thermal resistance, vacuum, inert gas or air as the conductor interlayer portions 37, the capacitance between the word lines WL can be reduced, and the operation speed of the memory cell can be improved.

In the third embodiment, by employing any one of an insulator having a high thermal resistance, vacuum, inert gas or air as the core portion, the heat generation temperature in the memory cell is increased, and also the localization of the heat generation portion is improved, so that the disturbance to the adjacent memory cells (that may cause data destruction in the adjacent memory cells) can be reduced.

Fourth Embodiment (Structure of Memory Cell)

An example of the cross-sectional structure of the memory pillar MP of the semiconductor storage device according to a fourth embodiment is described.

Figure 42:
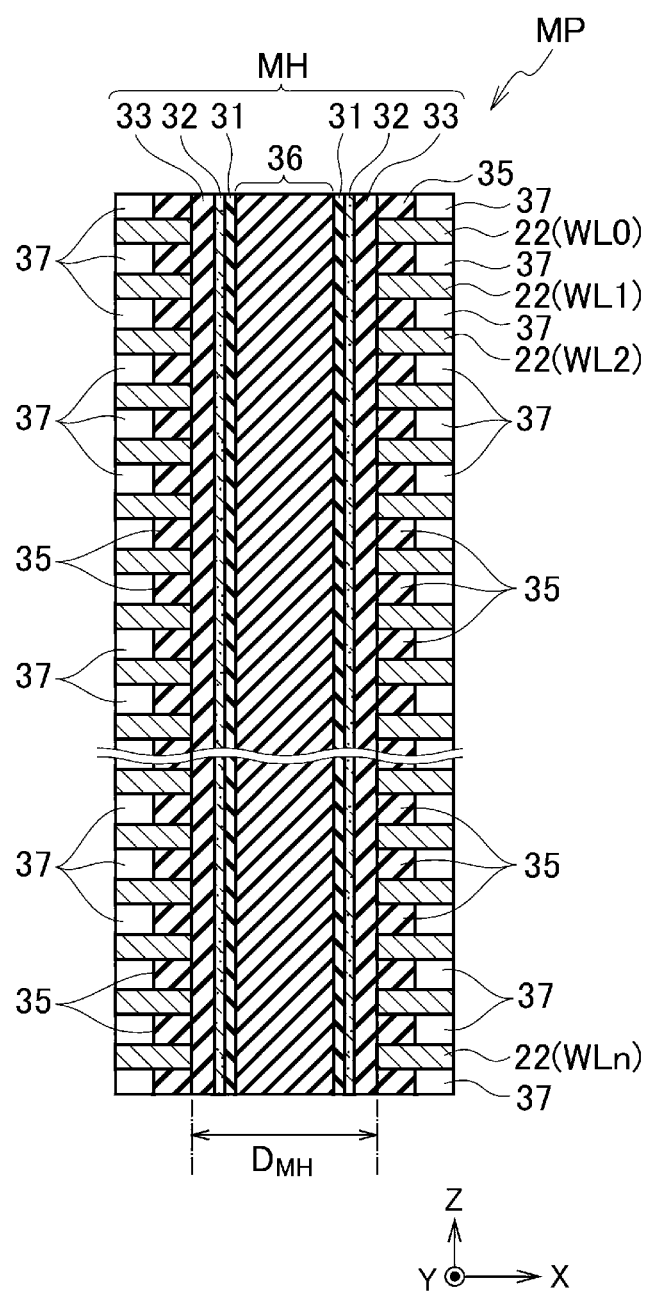
FIG. 42 is a cross-sectional view of a memory pillar in the semiconductor storage device according to a fourth embodiment.

FIG. 42 illustrates an example of the cross-sectional structure of the three-dimensionally stacked memory pillar MP in the semiconductor storage device according to the fourth embodiment. As illustrated in FIG. 42, the memory pillar MP includes, for example, the conductor layers 22, and the conductor interlayer portions 37 interposed between the conductor layers 22. The conductor interlayer portion 37 further includes the insulator layers 35 that are in contact with the insulator layer 33. Therefore, in the semiconductor storage device according to the fourth embodiment, the structure of the portion of the conductor interlayer portion 37 sandwiched between the conductor layers 22 has a structure of combining the first embodiment and the third embodiment. The conductor interlayer portions 37 are located between the conductor layers 22 adjacent to each other in the Z direction.

The conductor interlayer portions 37 and the conductor layers (voltage applying electrodes) 22 are alternately stacked. The conductor layer 22 is formed in a plate shape, for example, expanding along the X-Y plane. For example, the plurality of stacked conductor layers 22 are used as the word lines WLn to WL0, respectively. The conductor layer 22 includes, for example, tungsten (W).

The memory pillar MP has a columnar shape extending in the Z direction and penetrates the conductor layers 22 and the conductor interlayer portions 37. The memory pillar MP includes, for example, the core portion 36, the variable resistance layer 31, the semiconductor layer 32, and the insulator layer 33. Specifically, the memory hole MH penetrating the stacked structure of the conductor layers 22 and the conductor interlayer portions 37 is provided. The memory hole MH has a cylindrical shape, for example, extending in the Z direction. The diameter $D_{MH}$ of the memory hole MH is as illustrated in FIG. 42. The memory pillar MP includes the insulator layer 33, the semiconductor layer 32, the variable resistance layer 31, and the core portion 36, which are stacked sequentially in that order from the inside (inner wall) of the memory hole MH. Specifically, the memory pillar MP includes the cylindrical insulator layer 33 that covers the inner wall of the memory hole MH and extends in the Z direction, the cylindrical semiconductor layer 32 that covers the inner wall of the insulator layer and extends in the Z direction, and the cylindrical variable resistance layer 31 that covers the inner wall of the semiconductor layer 32 and extends in the Z direction.

Here, vacuum, inert gas, or air may be employed as the conductor interlayer portion 37. The degree of vacuum in case of removing the conductor interlayer portion 37 to form a vacuum region is as described above in the third embodiment.

When the conductor interlayer portions 37 are inert gas, for example, a rare gas such as helium, neon, argon, krypton, xenon, radon, or oganesson, or a nitrogen gas may be used.

An insulator having a high thermal resistance may be located on the insulator layer 35 that is in contact with the insulator layer 33. The insulator layer 35 can be formed with $HfO_2$. In addition, the insulator layer 35 may be formed with $SiO_2$ in the same manner as the insulator layer 33. By locating the insulator layer 35 that is in contact with the insulator layer 33, the mechanical strength can be improved between the conductor layers 22 together with the packing properties.

In the structure of the fourth embodiment, by arranging the insulator layer 35 that is in contact with the insulator layer 33 between the conductor layers 22, the relative electric field strength between the conductor layers 22 can be increased due to the electric field that surrounds the insulator layer 35. As a result, the on-state resistance of the memory cell can be reduced so that the cell current can be increased. The resistance ratio of the variable resistance layer 31 when the memory cell is turned on and off can be raised. The other configurations are the same as those in the third embodiment.

(Structure of Memory Cell Array 110)

Hereinafter, an example of the cross-sectional structure of the memory cell array 110 of the semiconductor storage device according to the fourth embodiment is described.

Figure 43:
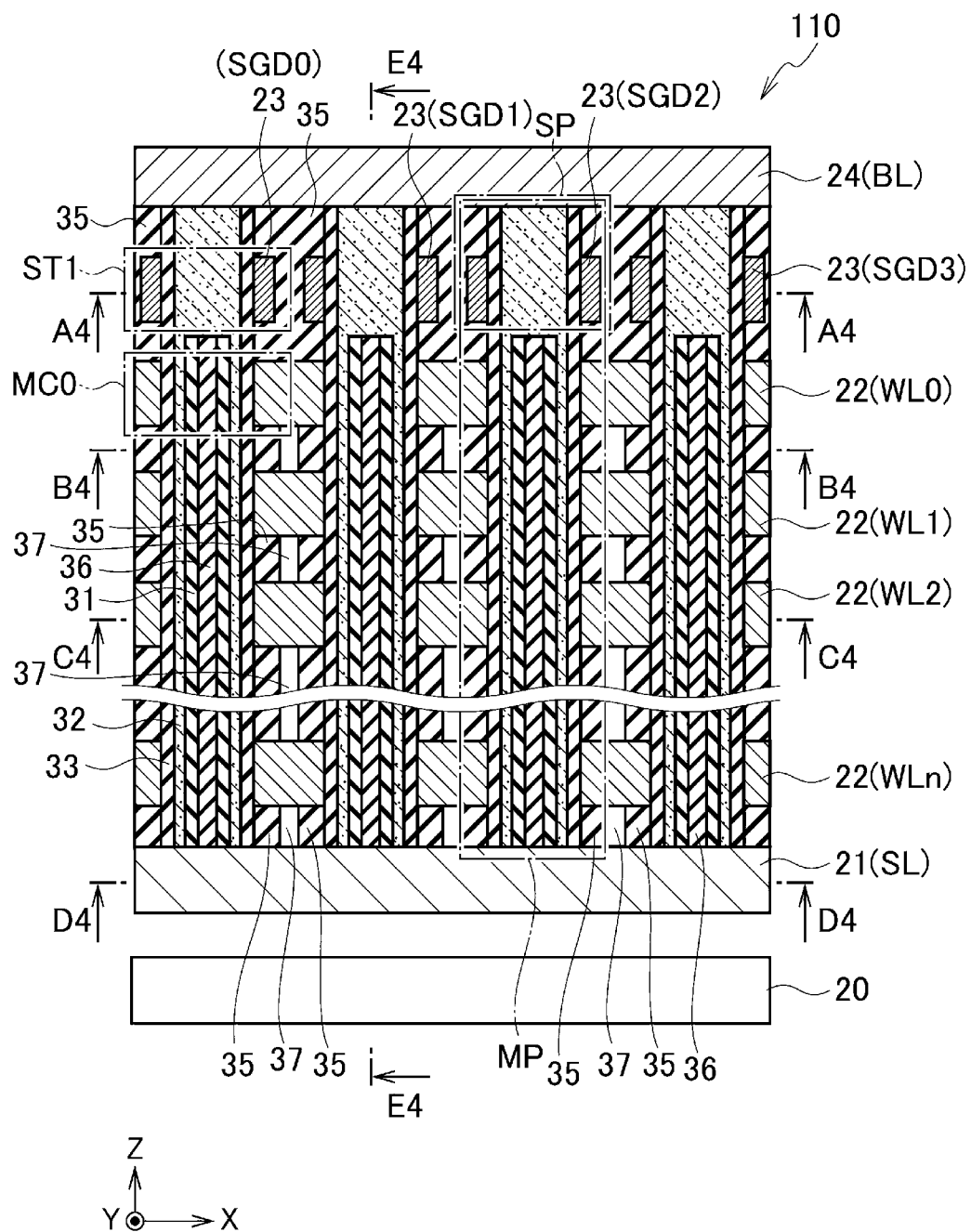
FIG. 43 is a cross-sectional view of the memory cell array of the semiconductor storage device according to the fourth embodiment.

FIG. 43 illustrates an example of the cross-sectional structure of the memory cell array 110 in the semiconductor storage device according to the fourth embodiment. As illustrated in FIG. 43, the memory cell array 110 includes, for example, the conductor layers 21 to 24. The conductor layers 21 to 24 are provided over the semiconductor substrate 20.

The conductor interlayer portions 37, the insulator layers 35, and the conductor layers (voltage applying electrodes) 22 are alternately stacked in the Z direction of the conductor layer 21. The conductor layer 22 is formed in a plate shape, for example, expanding along the X-Y plane. For example, the plurality of stacked conductor layers 22 are used as the word lines WLn to WL0, respectively, in an order from the semiconductor substrate 20 side.

The memory pillar MP has a columnar shape extending along the Z direction and penetrates the conductor layers 22, the conductor interlayer portions 37, and the insulator layers 35, so that the bottom portion reaches the conductor layer 21. The memory pillar MP includes, for example, the core portion 36, the variable resistance layer 31, the semiconductor layer 32, and the insulator layer 33. Specifically, the memory hole MH penetrates the stacked structure of the conductor layers 22, the conductor interlayer portions 37, and the insulator layers 35 so that the bottom portion thereof reaches the conductor layer 21. The memory hole MH has a cylindrical shape extending, for example, in the Z direction. The memory pillar MP includes the insulator layer 33, the semiconductor layer 32, the variable resistance layer 31, and the core portion 36, which are stacked sequentially in that order from inside (inner wall) of the memory hole MH. Specifically, the memory pillar MP includes the cylindrical insulator layer 33 that covers the inner wall of the memory hole MH and extends in the Z direction, the cylindrical semiconductor layer 32 that covers the inner wall of the insulator layer 33 and extends in the Z direction, and the cylindrical variable resistance layer 31 that covers the inner wall of the semiconductor layer 32 and extends in the Z direction.

The bottom portions of the core portion 36, the variable resistance layer 31, the semiconductor layer 32, and the insulator layer 33 of the memory pillar MP are in contact with the conductor layer 21. The other configurations are the same as those in the first embodiment.

Figure 44:
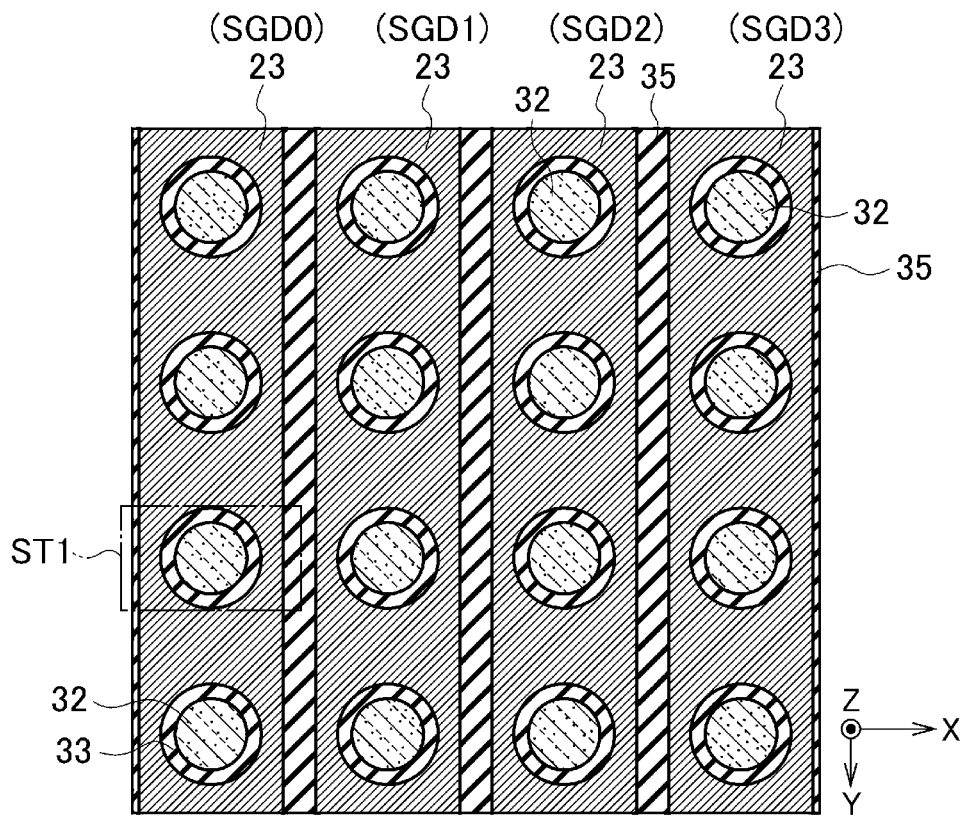
FIG. 44 illustrates a cross-section taken along line A4-A4 in FIG. 43.

Subsequently, the plane pattern configuration of the conductor layer 23 is described with reference to FIG. 44. FIG. 44 illustrates a cross-section taken along line A4-A4 in FIG. 43.

As illustrated in FIG. 44, the insulator layer 33 and the semiconductor layer 32 are provided in the SGD hole SH that penetrates the conductor layer 23. Also, the conductor layer 23 functions as the gate lines SGD0 to SGD3 of the select transistor ST1, and the insulator layer 33 functions as the gate insulating film of the select transistor ST1, and the semiconductor layer 32 functions as the semiconductor layer of the select transistor ST1. The memory pillar MP can be selected for each word line by using this select transistor ST1. By causing the select transistor ST1 to enter an on state, an inversion layer is formed on the semiconductor layer 32 that is in contact with the variable resistance layer 31 of the memory pillar MP, and the memory pillar MP can be selected by flowing the current via the inversion layer.

Subsequently, the plane pattern configuration between the memory cells MC in the Z direction is described with reference to FIG. 45.

Figure 45:
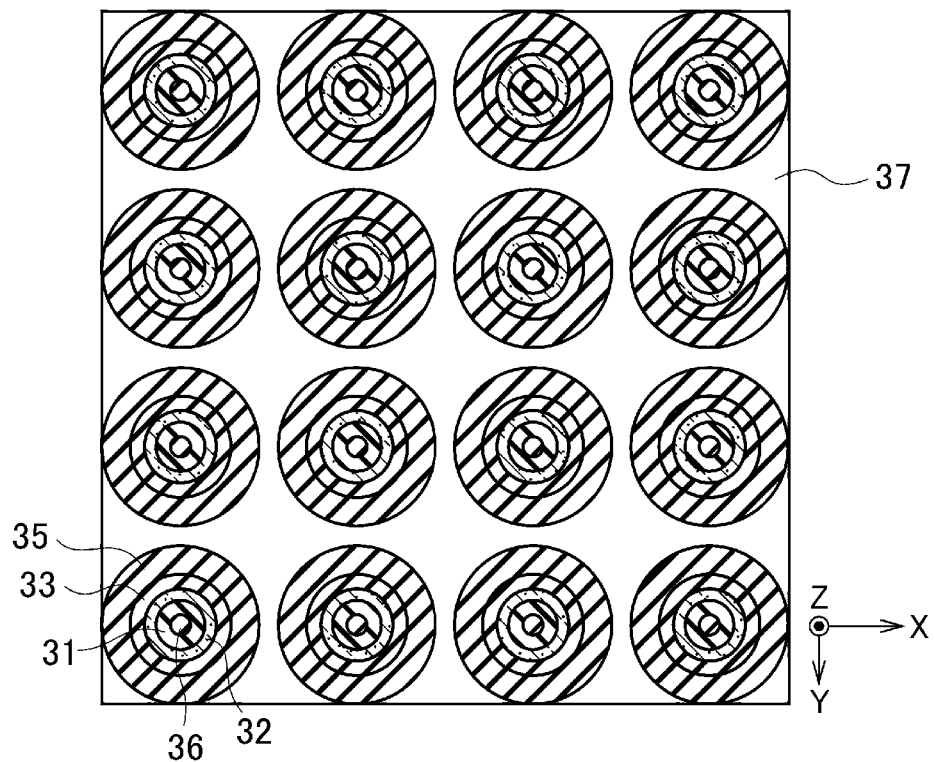
FIG. 45 illustrates a cross-section taken along line B4-B4 in FIG. 43.

FIG. 45 illustrates a cross-section taken along line B4-B4 in FIG. 43. The core portion 36, the variable resistance layer 31, the semiconductor layer 32, and the insulator layer 33 illustrated in FIG. 45 form parts of the memory cells MC in the Z direction, and the current flows in the semiconductor layer 32.

Figure 46:
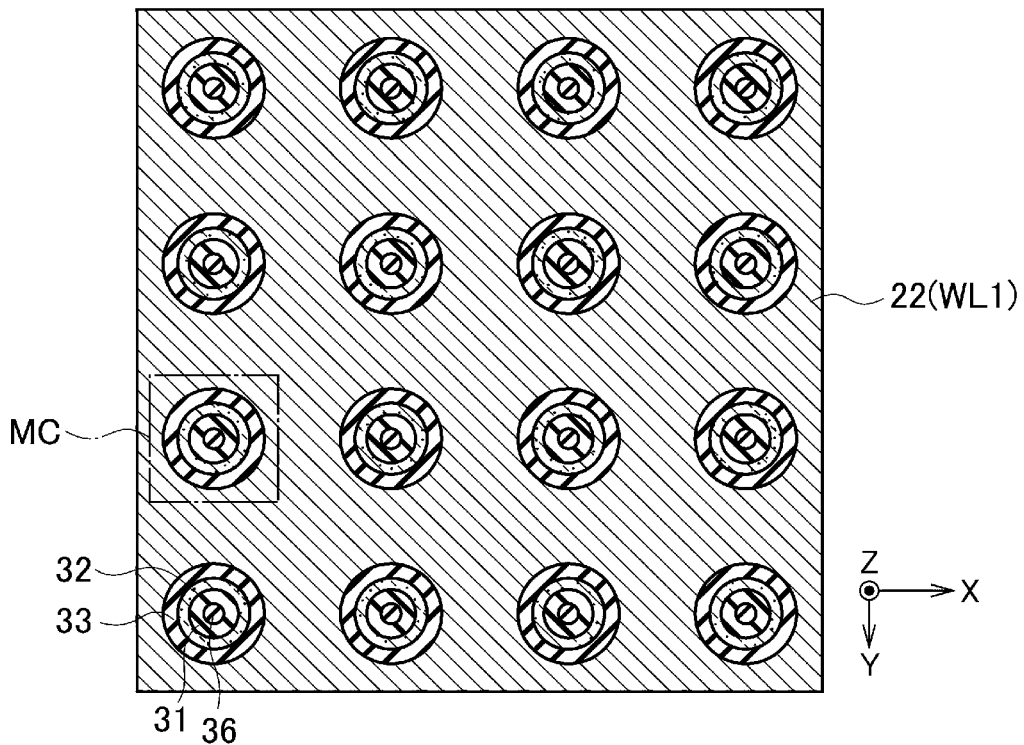
FIG. 46 illustrates a cross-section taken along line C4-C4 in FIG. 43.
Figure 47:
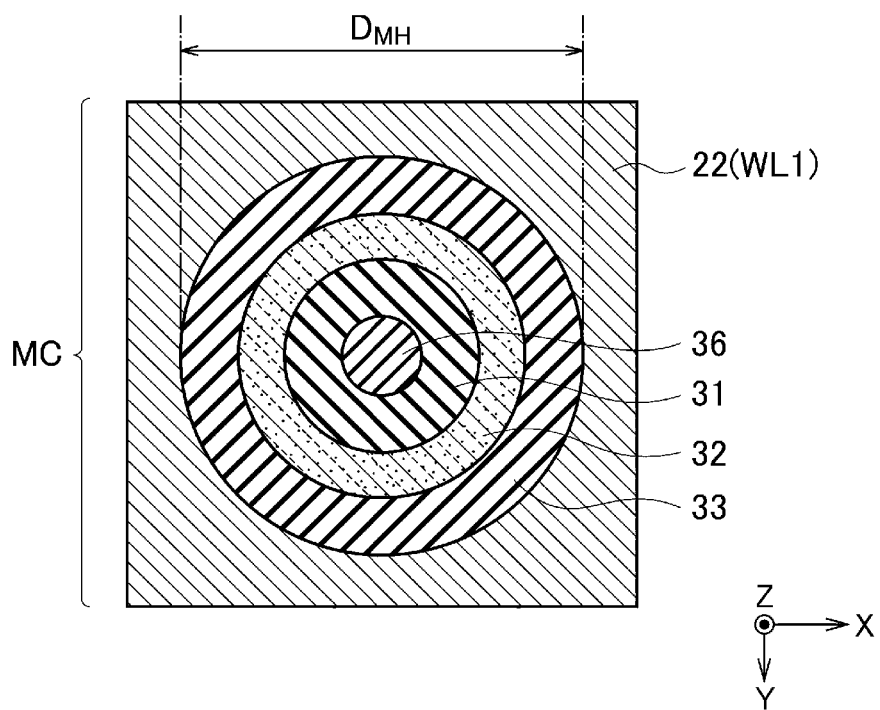
FIG. 47 is a plan view of one memory cell of the semiconductor storage device according to the fourth embodiment.

Subsequently, the plane pattern configuration of the conductor layer 22 is described with reference to FIGS. 46 and 47. FIG. 46 illustrates a cross-section taken along line C4-C4 in FIG. 43. FIG. 47 is a plan view of one memory cell MC.

As illustrated in FIG. 47, the memory cell MC is provided at an intersection between the plate-shaped word line WL and the memory pillar MP. Specifically, as illustrated in FIG. 47, the insulator layer 33, the semiconductor layer 32, the variable resistance layer 31, and the core portion 36 are provided in the memory hole MH penetrating the conductor layer 22 and having the diameter $D_{MH}$. Also, the conductor layer 22 functions as the word line WL of the selector SW of the memory cell MC, the insulator layer 33 functions as a gate insulating film of the selector SW of the memory cell MC, and the semiconductor layer 32 functions as the semiconductor layer of the selector SW of the memory cell MC. The variable resistance layer 31 functions as the storage element MR of the memory cell MC.

Subsequently, the plane pattern configuration of the conductor layer 21 is described. The cross-section taken along line D4-D4 in FIG. 43 is shown in the same manner as in FIG. 11.

The conductor layer 21 has a plate shape and is set to a constant low voltage in order to cause the current to flow from the bit lines BL. As illustrated in FIG. 11, the conductor layer 21 (source line) has a plate shape in the same manner as the conductor layer 22 (word line).

Subsequently, an example of the cross-sectional structure of the memory cell array 110 is described with reference to FIG. 48.

Figure 48:
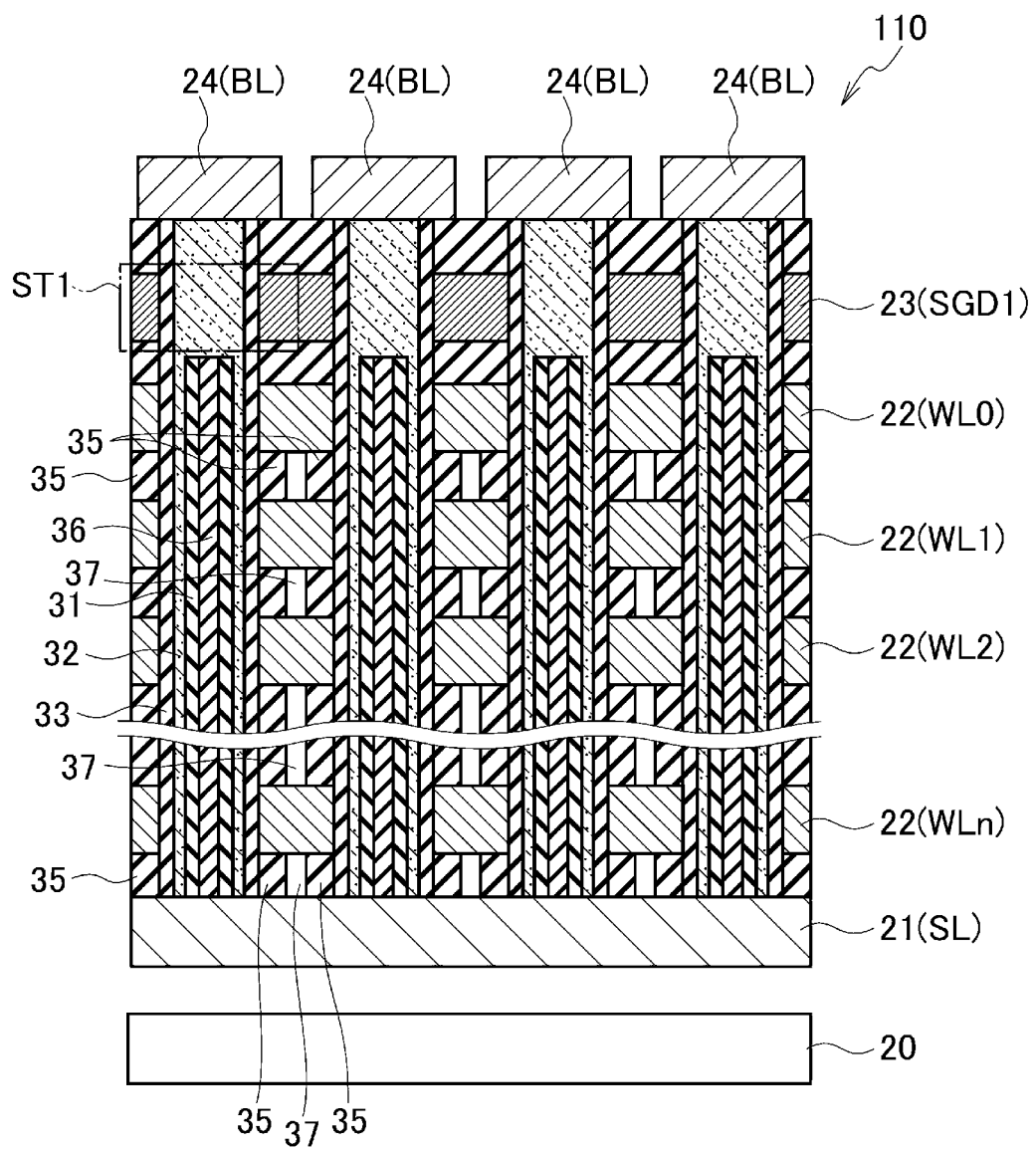
FIG. 48 illustrates a cross-section taken along line E4-E4 in FIG. 43 in a direction orthogonal to FIG. 43.

FIG. 48 illustrates a cross-section taken along line E4-E4 in FIG. 43. FIG. 48 is a cross section in a direction orthogonal to FIG. 43. With reference to FIGS. 43 and 48, it can be understood that the memory pillar MP has a concentric shape about the core portion 36.

Effect of Fourth Embodiment

According to the fourth embodiment, by locating the insulator layer 35 to be in contact with the insulator layer 33 on the conductor interlayer portions 37 between the conductor layers 22, the relative electric field strength between the conductor layers 22 can be increased due to the electric field surrounding the insulator layer 35. As a result, the on-state resistance of the memory cell transistor can be reduced so that the cell current can be increased.

According to the fourth embodiment, by employing any one of an insulator having a high thermal resistance, vacuum, inert gas or air as the conductor interlayer portions 37, the heat insulating effect can be raised. By employing any one of an insulator having a high thermal resistance, vacuum, inert gas or air as the conductor interlayer portions 37, the capacitance between the word lines WL can be reduced, and the operation speed of the memory cell can be improved.

In the fourth embodiment, by employing any one of an insulator having a high thermal resistance, vacuum, inert gas or air as the core portion, the heat generation temperature in the memory cell is increased, and also the localization of the heat generation portion is improved, so that the disturbance to the adjacent memory cells (that may cause data destruction in the adjacent memory cells) can be reduced.

Further, in the semiconductor storage device according to the fourth embodiment, by employing the configuration of the semiconductor storage device according to the second embodiment, that is, the configuration where the insulator layer is further provided between the core portion and the variable resistance layer, the melting of the variable resistance layer into the core portion can be prevented, and it is possible to provide the semiconductor storage device with excellent operation stability and excellent reliability.

In the semiconductor storage devices according to the first and fourth embodiments, specifically, the storage element MR of the memory cell MC may have a configuration including any one of (II) alternate stacking of GeTe and $Sb_2Te_3$ as interfacial phase transition elements, (III) alternate stacking of GeTe and BiSbTe as interfacial phase transition elements, (IV) alternate stacking of Ge, Sb, and Te, or a chalcogenide material, (V) $TiO_X$, $WO_X$, $HfO_X$, or $TaO_X$ as a variable resistance film, and (V) a CoFe alloy and a NiFe alloy as an MTJ element, in addition to (I) the above alloy-type phase transition element ($Ge_2Sb_2Te_5$).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a memory cell including
      a core portion that extends in a first direction above a semiconductor substrate;
      a variable resistance layer that extends in the first direction and is in contact with the core portion;

a semiconductor layer that extends in the first direction and is in contact with the variable resistance layer;
a first insulator layer that extends in the first direction and is in contact with the semiconductor layer; and
a first voltage applying electrode that extends in a second direction orthogonal to the first direction and is in contact with the first insulator layer,
wherein the core portion is a vacuum region, and a degree of vacuum in the vacuum region is one of low vacuum, medium vacuum, high vacuum, and ultra-high vacuum.

2. The semiconductor storage device according to claim 1, further comprising:
a memory cell string including a first select transistor, the memory cell, and a plurality of other memory cells,
the first select transistor including
the semiconductor layer that extends in the first direction;
the first insulator layer that extends in the first direction and is in contact with the semiconductor layer; and
a second voltage applying electrode that extends in the second direction and is in contact with the first insulator layer,
wherein the memory cell and the plurality of other memory cells are connected to each other in series in the first direction,
the first select transistor is connected to a first end of the memory cells connected in series, and
a third voltage applying electrode is connected to a second end of the memory cells connected in series.

3. The semiconductor storage device according to claim 1, wherein the variable resistance layer is a phase change element, and includes at least one of: (i) GeTe and Sb2Te3; (ii) GeTe and BiSbTe; and (iii) Ge, Sb, and Te, or a chalcogenide material.

4. The semiconductor storage device according to claim 1, wherein the variable resistance layer includes at least $TiO_X$, $WO_X$, $HfO_X$, or $TaO_X$.

5. A semiconductor storage device comprising:
a memory string including a memory cell and a plurality of other memory cells;
the memory cell including
a core portion that extends in a first direction above a semiconductor substrate;
a cylindrical variable resistance layer that extends in the first direction and covers an outer circumference of the core portion;
a semiconductor layer that extends in the first direction and covers an outer circumference of the variable resistance layer;
a first insulator layer that extends in the first direction and covers an outer circumference of the semiconductor layer; and
a first voltage applying electrode that extends in a second direction orthogonal to the first direction and covers a portion of an outer circumference of the first insulator layer;
a second voltage applying electrode above the first voltage applying electrode in the first direction; and
a third voltage applying electrode below the first voltage applying electrode in the first direction,
wherein the memory cell and the plurality of other memory cells are connected to each other in series in the first direction, and an insulator having high thermal resistance, vacuum, inert gas, or air is provided between the first and second voltage applying electrodes and between the first and third voltage applying electrodes, and wherein the core portion is a vacuum region, or a region containing inert gas.

6. The semiconductor storage device according to claim 5, further comprising:
a cylindrical second insulator layer that extends in the first direction and is between the core portion and the variable resistance layer.

7. The semiconductor storage device according to claim 6, wherein the memory string further includes a first select transistor,
the first select transistor including
a columnar semiconductor layer that extends in the first direction,
a second insulator layer that extends in the first direction and covers an outer circumference of the columnar semiconductor layer, and
a fourth voltage applying electrode that extends in the second direction and covers an outer circumference of the second insulator layer; and
wherein the first select transistor is connected to a first end of the memory cells connected in series, and
a fifth voltage applying electrode is connected to a second end of the memory cells connected in series.

8. The semiconductor storage device according to claim 6, wherein the core portion is a vacuum region and a degree of vacuum in the vacuum region is one of low vacuum, medium vacuum, high vacuum, and ultra-high vacuum.

9. The semiconductor storage device according to claim 6, wherein the core portion contains inert gas and the inert gas is either rare gas or nitrogen gas.

10. The semiconductor storage device according to claim 6, wherein the variable resistance layer is a phase change element, and includes at least one of: (i) GeTe and Sb2Te3; (ii) GeTe and BiSbTe; and (iii) Ge, Sb, and Te, or a chalcogenide material.

11. The semiconductor storage device according to claim 6, wherein the variable resistance layer includes at least $TiO_X$, $WO_X$, $HfO_X$, or $TaO_X$.

12. The semiconductor storage device according to claim 5, further comprising:
another insulator in contact with the first insulator layer between the first and second voltage applying electrodes and between the second and third voltage applying electrodes.

13. A semiconductor storage device comprising:
first voltage applying electrodes and conductor interlayer portions that are alternately stacked in a first direction above a semiconductor substrate,
a memory pillar extending through the first voltage applying electrodes and the conductor interlayer portions in the first direction, the memory pillar including
a cylindrical first insulator layer that extends in the first direction,
a cylindrical first semiconductor layer that covers an inner wall of the first insulator layer and extends in the first direction,
a cylindrical variable resistance layer that covers an inner wall of the first semiconductor layer and extends in the first direction, and
a core portion that is surrounded by the variable resistance layer;
a second voltage applying electrode above the first voltage applying electrodes in the first direction, separated from the first voltage applying electrodes by an insulating layer, and connected to a first end portion of the memory pillar;

a cylindrical second insulator layer that extends in the first direction through the second voltage applying electrode and the insulating layer;

a cylindrical second semiconductor layer that covers an inner wall of the second insulator layer, extends in the first direction, and is connected to the first semiconductor layer; and a third voltage applying electrode connected to a second end portion of the memory pillar, wherein the core portion is a vacuum region, or a region containing inert gas.

14. The semiconductor storage device according to claim 13, further comprising:

a cylindrical third insulator layer that extends in the first direction and is located between the core portion and the variable resistance layer.

15. The semiconductor storage device according to claim 13, wherein the conductor interlayer portion is a vacuum region, or a region containing inert gas or air.

16. The semiconductor storage device according to claim 13, further comprising:

a fourth voltage applying electrode that is connected to the second semiconductor layer and extends in a second direction orthogonal to the first direction; and a sequencer configured to apply a voltage between the fourth voltage applying electrode and the third voltage applying electrode to perform a read operation or a write operation.

17. The semiconductor storage device according to claim 13, wherein a thickness of the variable resistance layer is 20 nm or less.

18. The semiconductor storage device according to claim 13, wherein the core portion is a vacuum region and a degree of vacuum in the vacuum region is one of low vacuum, medium vacuum, high vacuum, or ultra-high vacuum.

19. The semiconductor storage device according to claim 13, wherein the core portion contains inert gas and the inert gas is either rare gas or nitrogen gas.

20. A semiconductor storage device comprising:

a memory cell including a core portion that extends in a first direction above a semiconductor substrate;

a variable resistance layer that extends in the first direction and is in contact with the core portion;

a semiconductor layer that extends in the first direction and is in contact with the variable resistance layer;

a first insulator layer that extends in the first direction and is in contact with the semiconductor layer; and a first voltage applying electrode that extends in a second direction orthogonal to the first direction and is in contact with the first insulator layer, wherein the core portion is a region containing inert gas, and the inert gas is either rare gas or nitrogen gas.

\* \* \* \* \*